United States Patent [19]
Takizawa

[11] Patent Number: 5,962,878
[45] Date of Patent: Oct. 5, 1999

[54] SURGE PROTECTION DEVICE AND METHOD OF FABRICATING THE SAME

[75] Inventor: Toru Takizawa, Tokorozawa, Japan

[73] Assignee: Citizen Watch Co., Ltd., Tokyo, Japan

[21] Appl. No.: 09/154,169

[22] Filed: Sep. 16, 1998

[30] Foreign Application Priority Data

Sep. 17, 1997 [JP] Japan .................................. 9-252257
Jan. 22, 1998 [JP] Japan .................................. 10-010068

[51] Int. Cl.$^6$ .......................... H01L 29/74; H01L 31/111
[52] U.S. Cl. ........................ 257/173; 257/110; 257/164; 438/140
[58] Field of Search .................................. 257/110, 109, 257/132, 164, 165, 166, 170, 171, 173, 174; 438/140

[56] References Cited

U.S. PATENT DOCUMENTS 4,546,401 10/1985 Svedberg .
5,148,254 9/1992 Matsuda et al. .
5,284,780 2/1994 Schulze et al. .............................. 437/6

OTHER PUBLICATIONS

Jpn. J. Appl. Phys. vol. 34 (1995) pp. 5993–5997 Part 1, No. 11, Nov. 1995.

Primary Examiner—Ngân V. Ngô
Attorney, Agent, or Firm—Armstrong, Westerman, Hattori, McLeland & Naughton

[57] ABSTRACT

In a bidirectional surge protection device formed on a semiconductor substrate, buried layers, which have the same conduction type as and are higher in impurity concentration than the semiconductor substrate, are formed on the entire surfaces of the device regions provided on both surfaces of the semiconductor substrate or formed under emitter-push restraining layers alone, wherein injection of minority carriers from a surface opposite to the surface on which the device operates is restrained to lower a holding current. As a result, the bidirectional surge protection device easily becomes OFF once it becomes ON.

10 Claims, 33 Drawing Sheets

SURGE PROTECTION DEVICE AND METHOD OF FABRICATING THE SAME

BACKGROUND OF THE INVENTION

1. Field of the Invention

The invention relates to a surge protection device for protecting communication equipment against surge noise generated by lightning, particularly to the construction of a surge protection device employing a semiconductor and a method of fabricating the same.

2. Description of the Related Art

A surge protection device is generally used for protecting electronic devices against noise. However, the invention relates to a surge protection device for protecting various communication equipment against surge noise generated by lightening, particularly to a surge protection device employing a semiconductor.

At first, it is described what is "surge" used in this specification. Generally, "surge" has same meaning as "undulation" or "swelling". That is, surge noise corresponds to noise wherein a voltage or a current varies periodically over time.

There are two kinds of surge noise which are generated by lightning. One kind is surge noise which is caused by the input of noise into a signal line when lightning strikes directly, and the other is surge noise which is caused by the mixing of a surge into a signal line when it is generated by electromagnetic induction (induction lightning) at the instant when lightning strikes at a remote place, wherein the former surge noise has a high voltage while the latter surge noise has a relatively low voltage, i.e., several hundred volts at a peak voltage value.

As a protection device for protecting against surge noise induced by an induction lightening, there are several types using ceramics, or using a dielectric or utilizing the switching of a semiconductor PN junction.

Particularly, since a semiconductor PN-junction switching is excellent in characteristics compared with a device utilizing ceramics or a dielectric, these devices have recently been replaced by the semiconductor PN-junction switching.

As switches utilizing the semiconductor PN junction, there is a thyristor having three junctions of pnpn. As phenomena serving as a trigger whereby a switch changes from OFF to ON, there are an avalanche breakdown phenomenon of a PN junction and a punch-through phenomenon which occurs in the case of two junctions of pnp or npn.

At the junction surfaces of a PN junction, there is a region where electrons or holes are repelled and a fixed charge alone remains, which is a so-called depletion layer (space charge region). The depletion layer is reduced until it becomes a fixed width when a positive or plus voltage is applied to a p-type region and a negative or minus voltage is applied to an n-type region (forward voltage is applied).

When the minus voltage is applied to a p-type region and the plus voltage is applied to an n-type region (reverse voltage is applied), the depletion layer is widened to a fixed width whereby the PN junction is broken.

Assuming that there is an NPN junction and a voltage is applied to an n-type region at one side, a depletion layer is widened from two junctions at a middle p-type region. When the depletion layers are joined with each other, it is considered the same as a case where the n-type regions at both sides are connected to each other by way of a resistance layer. This is the so-called punch-through phenomenon.

The surge protection device which is the subject of this invention utilizes this punch-through phenomenon as a trigger by which the pnpn thyristor is switched ON. There are two types of surge protection devices, one is a directional device which operates only at one side and a bidirectional device which operates at both sides thereof The surge protection device of the invention solves the problems of the bidirectional device.

Described hereinafter is the construction of a conventional bidirectional surge protection device and a method of fabricating the same, and the principle of operation.

The construction of the conventional bidirectional surge protection device will be first described with reference to the sectional view of FIG. 30.

As shown in FIG. 30, device regions 33, 33 are provided on both surfaces, namely, a front surface 4 and a back surface 6 of a semiconductor substrate 2. Base layers 20 are selectively formed on the device regions 33 for determining a voltage at which the device becomes ON. Emitter layers 18 are formed on the upper portions alone of the base layers 20 so as to determine the width of the base layers 20 and to inject minority carriers into the base layers 20 after the device becomes ON.

The mere formation of the base layers 20 and the emitter layers 18 produces stage portions of diffusion layers at the end portions of the base layers 20 when forming the emitter layers 18 by diffusing them. This is referred to as an "emitter-push".

Electric field is concentrated at these portions where the operation of the device is not uniformly performed over the entire surface of the base layers 20. Accordingly, there are provided emitter-push restraining layers 16 on both sides of the base layers 20 and emitter layers 18, wherein the emitter-push restraining layers 16 are higher in impurity concentration than the base layers 20 and they have the same conduction type as the base layers 20, and whereby the stage portions of the diffusion layers where the electric field is concentrated are removed.

The base layers 20, the emitter layers 18 and the emitter-push restraining layers 16 are collectively referred to as the device regions 33.

Further, there are provided electric field relaxation layers 42 on both surfaces of the semiconductor substrate 2 which surround the peripheries of the device regions 33 to maintain a sufficient withstand voltage so as to avoid break down in a lateral direction. LOCOS (local oxidation of silicon) films 14 are selectively formed on both surfaces of the semiconductor substrate 2 to separate the device regions 33 from other regions, while PSG films 24 as interlayer insulators are formed on the LOCOS films 14 provided on both surfaces of the semiconductor substrate 2 to reduce the influence of the electric field to be applied to end portions of the metallic electrodes.

Contact holes 26, 26 are formed at both surfaces of the semiconductor substrate 2 for securing connection between the metallic electrodes and the device regions 33, and a front metal electrode 28 and a back metal electrode 30 are respectively provided on the contact holes 26, 26.

Passivation films 34, for protecting the device against the external environment and for securing reliability, are formed on the front metal electrode 28 and the back metal electrode 30 provided on both surfaces of the semiconductor substrate 2, and on the device regions 33, 33 provided on both surfaces of the semiconductor substrate 2, opening portions 36 of passivation film 34 are formed considering the subsequent mounting thereof.

A method of fabricating the conventional bidirectional surge protection device will be now described. Each step of fabricating the surge protection device will be described with reference to sectional views shown in FIGS. 24 to 30. Conditions in the method of fabricating the surge protection device are explained with reference to the case for manufacturing a surge protection device which operates at 240 V First, as shown in FIG. 24, pad oxidation films 8 are formed on both surfaces of the front surface 4 and the back surface 6 of the semiconductor substrate 2 in a thickness of 40 nm for relaxing the stress when forming the LOCOS films 14, and silicon nitride films 10 used for forming the LOCOS films serving as films for impeding the formation of the LOCOS films are formed on the upper layers of the pad oxidation films 8 in a thickness of 150 nm are provided on both surfaces of the semiconductor substrate 2.

Photoresists 50, which become masks for etching the silicon nitride films 10 forming LOCOS films, are subject to patterning by a photolithography process on both surfaces of the semiconductor substrate 2 so that the silicon nitride films 10 forming LOCOS films are subject to patterning by dry etching as shown in FIG. 24. Thereafter, the photoresists 50 are removed.

Next, as shown in FIG. 25, photoresists 51, which become masks when implanting ions therein, are subject to patterning on both surfaces of the semiconductor substrate 2 by a photolithography process, then boron which is a p-type impurity is implanted in both surfaces of the semiconductor substrate 2 at a dose of $1.0 \times 10^{15}$ atoms/cm$^2$ with 30 KeV energy. Thereafter, the photoresists 51 are removed.

The regions in which the p-type impurity is implanted become emitter-push restraining layers 16 which are necessary for avoiding electric field concentration at end portions of base layers and emitter layers, formed later.

Further, the pad oxidation films 8 are selectively oxidized at 1140° C., with a flow rate of $O_2/N_2=0.06/9.0$ liters/min, for 440 minutes while the silicon nitride films 10 forming LOCOS films shown in FIG. 25 serve as oxidation prevention films, thereby forming the LOCOS films 14 in a thickness of 500 nm. At the same time when LOCOS films 14 are formed, the emitter-push restraining layers 16 and the electric field relaxation layers 42 are formed by a drive-in process.

The electric field relaxation layers 42 are formed to surround the peripheries of the device regions to provide sufficient withstand voltage so as to avoid break down in the lateral direction. Thereafter, the silicon nitride films 10 forming LOCOS films are removed.

Thereafter, boron which is a p-type impurity is implanted in both surfaces of the semiconductor substrate 2 at a dose of $7.0 \times 10^{12}$ atoms/cm$^2$ with 60 KeV energy while the LOCOS films 14 serve as ion implantation masks.

Thereafter, the drive-in is performed at 1140° C. for 30 hours in a nitrogen atmosphere, thereby forming the base layers 20 as shown in FIG. 27. The base layers 20 determine the operation voltage when the depletion layers are widened when the device operates.

Subsequently, phosphorus which is an n-type conduction impurity is implanted in both surfaces of the semiconductor substrate 2 at a dose of $5 \times 10^{15}$ atoms/cm$^2$ with 80 KeV energy. The drive-in is performed at 1100° C., with a flow rate of $O_2/N_2=0.45/8.55$ liters/min. for 110 minutes, thereby forming emitter layers 18 as shown in FIG. 28.

The emitter layers 18 are formed on the base layers 20 for determining each width of the base layers 20 for determining an operation voltage and for serving as a path through which a current flows by implanting minority carriers in the base layers 20 when the device is ON.

Thereafter, phosphine silicate glass films (PSG films) 24 are formed on both surfaces of the semiconductor substrate 2 in a thickness of 500 nm at 460° C. for 1 minute as shown in FIG. 29 using a mixed gas of phosphine (PH$_3$) and monosilane (SiH$_4$) by a thermal-chemical vapor deposition (CVD) process.

The PSG films 24 are formed to relax the influence of the electric field applied to the surfaces between the semiconductor substrate 2 and the LOCOS films 14 at the end portions of the metal electrodes formed later.

Subsequently, as shown in FIG. 29, photoresists 52, which become etching masks, are subject to patterning on both surfaces of the semiconductor substrate 2 by a photolithography process, then the LOCOS films 14 and the PSG films 24 are etched by wet etching to form the contact holes 26. Thereafter, the photoresists 52 are removed.

Next, as shown in FIG. 30, the front metal electrode 28 is formed on the front surface 4 of the semiconductor substrate 2 in a thickness of 1000 nm by the sputtering and patterning while the back metal electrode 30 is formed on the back surface 6 of the semiconductor substrate 2 in a thickness of 1000 nm by the sputtering and patterning, then sintering is performed at 380° C. in a hydrogen atmosphere for 60 minutes.

Then, the silicon nitride films are formed on both surfaces of the semiconductor substrate 2 as the passivation films 34 in a thickness of 800 nm by a plasma CVD process, and thereafter photoresists which become etching masks are subject to patterning by a photolithography process to define the openings 36 in the passivation films 34 by dry etching.

In such a manner, a bidirectional surge protection device is completed as shown in FIG. 30.

Next, the operation principle of the surge protection device will be described with reference to FIGS. 31 and 32.

For explaining the example of the operation principle, the conduction types of the constituents of the semiconductor of the surge protection device shown in FIG. 30 are n-type in semiconductor substrate 2, p-type in the emitter-push restraining layers 16 and the electric field relaxation layers 42, which are higher in impurity concentration than the base layers 20, and n-type emitter layers 18, which are higher in impurity concentration than the semiconductor substrate 2, and p-type in the base layers 20.

First as shown in FIG. 31, a front metal electrode 28 of the front surface 4 is grounded and the plus voltage is applied to the back metal electrode 30 from a power supply 60. As a result, the PN junction between the base layers 20 on the front surface 4 and the semiconductor substrate 2 is reversely biased so that the depletion layer 38 stretches within the base layers 20 and to the semiconductor substrate 2.

At this time, current scarcely flows between the front metal electrode 28 of the front surface 4 and the back metal electrode 30 of the back surface 6. At this time, the electric field relaxation layers 42 relax the electric field applied to the depletion layer 38 which laterally stretches so as to avoid break down at the PN junction in the lateral direction. In this state the device is OFF.

FIG. 32 shows an example of characteristics of a device which operates at 240 V.

If the plus voltage applied to the back metal electrode 30 shown in FIG. 31 increases, the depletion layer 38 within the base layers 20 further stretches to reach the emitter layers 18, so that a punch-through phenomenon occurs (a point denoted by a circle P in FIG. 32). Then, a current flows as if the emitter layers 18 and the semiconductor substrate 2 are connected to each other via a resistor.

The constituents of the current are holes 40 which are injected from the emitter-push restraining layers 16 of the back surface 6 and electrons 41 which are injected from the emitter layers 18 of the front surface 4 owing to the punch-through phenomenon.

The main current which is important until the device becomes ON after the occurrence of the punch-through phenomenon is a hole current. If the hole current starts to flow, a potential increases at the middle position 44 of the base layers 20 which are clamped between the emitter-push restraining layers 16.

If the potential increases to exceed a threshold value, the electrons 41 enter the emitter layers 18 at once since the emitter layers 18 and the base layers 20 are forwardly biased. A current value Ibo immediately before being ON is, for example, about 100 mA to 200 mA.

The device becomes ON when this phenomenon occurs. A voltage value Von at the time when the device is ON is, for example, about 2 V to 3 V.

A method of using the surge protection device is next described. Since the surge protection device serves as a bypath to escape noise which has entered a delicate communication line or electronic equipment, the surge protection devices are disposed in parallel with the communication line and the electronic equipment. The surge protection device becomes ON only at the time of entrance of surge noise having a voltage which is not tolerable to the communication line or the electronic equipment to allow the noise to escape thus protecting the communication line or the electronic equipment.

Accordingly, although it is important to remove the surge noise, it is also important to return the device to its original state after the surge noise is removed. If the device remains ON and does not immediately become OFF, a current flows from the communication line or the electronic equipment.

The surge protection device is set to become OFF at a current value which exceeds a normal current flowing through the communication line or the electronic equipment once the device is ON but within a scope which is tolerable to the equipment. The current at the time when the device is OFF is the so-called holding current.

It is desirable that the holding current is somewhat high. However, in the conventional bidirectional surge protection device, the holding current is lower than that of a directional surge protection device which is fabricated on one side in the same construction as shown in FIG. 30. The comparison of these devices' characteristics is explained with reference to FIG. 33.

Both the directional device and bidirectional device have substantially the same characteristics until they become ON wherein a punch-through phenomenon occurs, for example, at 240 V and they become ON when the current value Ib0 is about 100 mA to 200 mA.

Thereafter, while the devices are changed to OFF, the directional device D1 becomes OFF when the holding current is, for example, about 200 mA (Ih1) while the bidirectional device D2 is not changed to OFF unless the holding current is, for example, lowered to about 20 mA (Ih2).

The reason for this is explained with reference to FIG. 34. Conduction types of components of the semiconductor in FIG. 34 are n-type in a semiconductor substrate 2, p-type in emitter push restraining layers 16 having high impurity concentration, p-type in base layers 20, and n-type in emitter layers 18 having high impurity concentration.

Although already explained above in the operation principle, it is necessary that the potential at the middle position 44 within the base layers 20 increases for the device to become ON. If the device becomes OFF, it is considered that a reverse phenomenon occurs.

That is, even if the voltage of the surge noise is lowered, the potential at the middle position 44 remains if the holes 40 are much injected from the back surface 6. Accordingly, the device is not changed to OFF, whereby a current continuously flows even at a low voltage, and hence the holding current becomes small.

The reason why the holding current becomes small if the device is fabricated as a bidirectional device will be now be described with reference to the construction using an n-type semiconductor substrate.

If the directional device is changed to the bidirectional device while keeping the construction as it is, the device regions 33 which are covered with p-type layers (the emitter-push restraining layers 16 and the base layers 20 ) at the entire surfaces thereof are positioned at the back surface 6 as shown in FIG. 30. Accordingly, the surface area of the p-type layers becomes large, and the amount of the injection of the holes 40 from the back surface 6 (FIG. 34) becomes excessively large compared with the case of the directional device.

Under these circumstances, in the conventional bidirectional surge protection device, the holding current becomes small and a current is taken in from equipment which are connected in parallel with each other. This causes a problem in that it becomes the same as when the equipment is short-circuited thus rendering the operation of the equipment anomalous.

SUMMARY OF THE INVENTION

It is an object of the invention to solve the problems which occur when a holding current of a surge protection device lowers, and it is another object of the invention to provide the construction of a surge protection device and a method of fabricating the same.

To achieve the above objects, the surge protection device of the invention is structured as follows.

That is, the surge protection device comprises a semiconductor substrate, buried layers formed on entire surfaces of device regions on both surfaces of the semiconductor substrate, said buried layers being higher in impurity concentration than the semiconductor substrate and restraining the injection of minority carriers, base layers selectively formed inside the buried layers to determine a voltage at which the device becomes ON, emitter layers formed on the upper portions alone of the base layers for injecting minority carriers after the device becomes ON, emitter-push restraining layers selectively formed inside the buried layers so as to avoid an electric field concentration at the end portions of the base and emitter layers to uniformly operate the device, and electric field relaxation layers formed on both surfaces of the semiconductor substrate to surround peripheries of device regions for keeping a sufficient withstand voltage so as to avoid break down in a lateral direction.

The surge protection device further comprises LOCOS films selectively formed on the peripheries of the device regions provided on both surfaces of the semiconductor substrate, interlayer insulators formed on the LOCOS films provided on both surfaces of the semiconductor substrate, metal electrodes formed on the device regions formed on both surfaces of the semiconductor substrate to overlap with the interlayer insulators at a part thereof, and passivation films formed on the peripheries of the device regions provided on both surface of the semiconductor substrate to overlap with the metal electrodes.

In this surge protection device described above, if the conduction type of the semiconductor substrate is n-type, the buried layers and the emitter layers are respectively n-type, while the emitter-push restraining layers, the electric field relaxation layers and the base layers are respectively p-type.

Further, if the conduction type of the semiconductor substrate is p-type, the buried layers and the emitter layers are respectively p-type, while the emitter-push restoring layer, the electric field relaxation layers and the base layers are respectively n-type.

A method of fabricating a surge protection device of the invention comprises the following steps when fabricating the above-mentioned surge protection device using an n-type semiconductor substrate:

a step of selectively forming n-type buried layers which are higher in impurity concentration than an n-type semiconductor substrate on all surfaces of device regions so as to restrain the injection of minority carriers in both surfaces of the n-type semiconductor substrate;

a step of selectively forming p-type emitter-push restraining layers inside the n-type buried layers on the device regions provided on both surfaces of the n-type semiconductor substrate so as to avoid an electric field concentration at end portions of base layers and emitter layers to be formed latter;

a step of forming p-type electric field relaxation layers so as to surround peripheries of the device regions provided on both surfaces of the n-type semiconductor substrate at the same time when the p-type emitter-push restraining layers are formed;

a step of forming p-type base layers on the device regions provided on both surfaces of the n-type semiconductor substrate, and matched by using LOCOS films after the LOCOS films are selectively formed on both surfaces of the n-type semiconductor substrate; and a step of forming n-type emitter layers on the upper portions alone of the p-type base layers in the device regions provided on both surfaces, and matched by using the LOCOS films.

Further, the method comprises the following steps:

a step of forming interlayer insulators on both entire surfaces of the n-type semiconductor substrate;

a step of subjecting photoresists to patterning on the interlayer insulators formed on both surfaces of the n-type semiconductor substrate by a photolithography process, then etching the interlayer insulators to form contact holes in the device regions provided on both surfaces of the n-type semiconductor substrate;

a step of forming metal electrodes on both surfaces of the n-type semiconductor substrate within contact holes;

a step of forming passivation films on both entire surfaces of the n-type semiconductor substrate; and a step of subjecting photoresists to patterning on the passivation films provided on both surfaces of the n-type semiconductor substrate using a photolithography process, then etching the passivation films to perforate the device regions on both surfaces.

A variation of the method of fabricating a surge protection device may comprise changes to the above-mentioned steps as follows when fabricating the above-mentioned surge protection device using a p-type semiconductor substrate.

In the step of forming the buried layers, p-type buried layers, which are higher in impurity concentration than the p-type semiconductor substrate, are selectively formed on all surfaces of device regions provided on both surfaces of the p-type semiconductor substrate.

In the step of forming emitter-push restraining layers and the electric field relaxation layers, n-type emitter-push restraining layers are selectively formed inside the p-type buried layers on the device regions provided on both surfaces of the p-type semiconductor substrate, and at the same time n-type electric field relaxation layers are formed so as to surround peripheries of the device regions provided on both surfaces of the p-type semiconductor substrate.

In the step of forming the base layers, n-type base layers are formed on the device regions provided on both surfaces of the p-type semiconductor substrate, and matched by using LOCOS films after the LOCOS films are selectively formed on both surfaces of the p-type semiconductor substrate.

In the step of forming the emitter layers, p-type emitter layers are formed on the upper portions alone of the n-type base layers in the device regions provided on both surfaces, and matched by using the LOCOS films.

In the surge protection device of the invention, it is more preferable to have a construction such that the n-type or p-type buried layers in the surge protection device may be formed under the emitter-push restraining layers alone provided on both surfaces of the n-type or p-type semiconductor substrate.

In this case, a method of fabricating the surge protection device of the invention is substantially the same as the above-mentioned method of fabricating the surge protection device, but in the step of forming the buried layers, the n-type or p-type buried layers, which have a higher impurity concentration than the n-type or p-type semiconductor substrate, are selectively formed on device regions provided on both surfaces of the n-type or p-type semiconductor substrate.

Further, in the step of forming the emitter-push restraining layers, the p-type or n-type emitter-push restraining layers are selectively formed on upper portions of the n-type or p-type buried layers provided on both surfaces of the n-type or p-type semiconductor substrate to avoid electric field concentration at end portions of the base layers and emitter layers.

Although the surge protection device of the invention is a bidirectional device, in the construction forming the surge protection device utilizing a semiconductor PN junction on the semiconductor substrate, a holding current is rendered to high value, thereby making a surge protection device embodying excellent OFF characteristics by providing the buried layers, which have the same conduction type as, and are higher in impurity concentration than, the semiconductor substrate, on all surfaces of the device regions, or at least under the emitter-push restraining layers.

That is, the reason why the holding current is lowered in the case of a bidirectional surge protection device is that a large amount of injection holes are provided from the back surface even if the surge noise is lowered in voltage.

Accordingly, if the amount of injection holes is restrained by providing buried layers, which have the same conduction type as, and are higher in impurity concentration than, the semiconductor substrate, under the device regions, the device cannot stay ON for a long period, and hence it quickly becomes OFF, thereby rendering the holding current high.

The above and other objects, features and advantages of the invention will be apparent from the following detailed description which is to be read in conjunction with the accompanying drawings.

DETAILED DESCRIPTION OF THE PREFERRED EMBODIMENT

A surge protection device according to first and second embodiments of the invention will now be described with reference to the attached drawings. That is, the invention explains optimum embodiments of a bidirectional surge protection device capable of securing a high holding current utilizing a punch-through phenomenon which is a phenomena in a semiconductor PN junction, and a method of fabricating the same.

Figure 1:
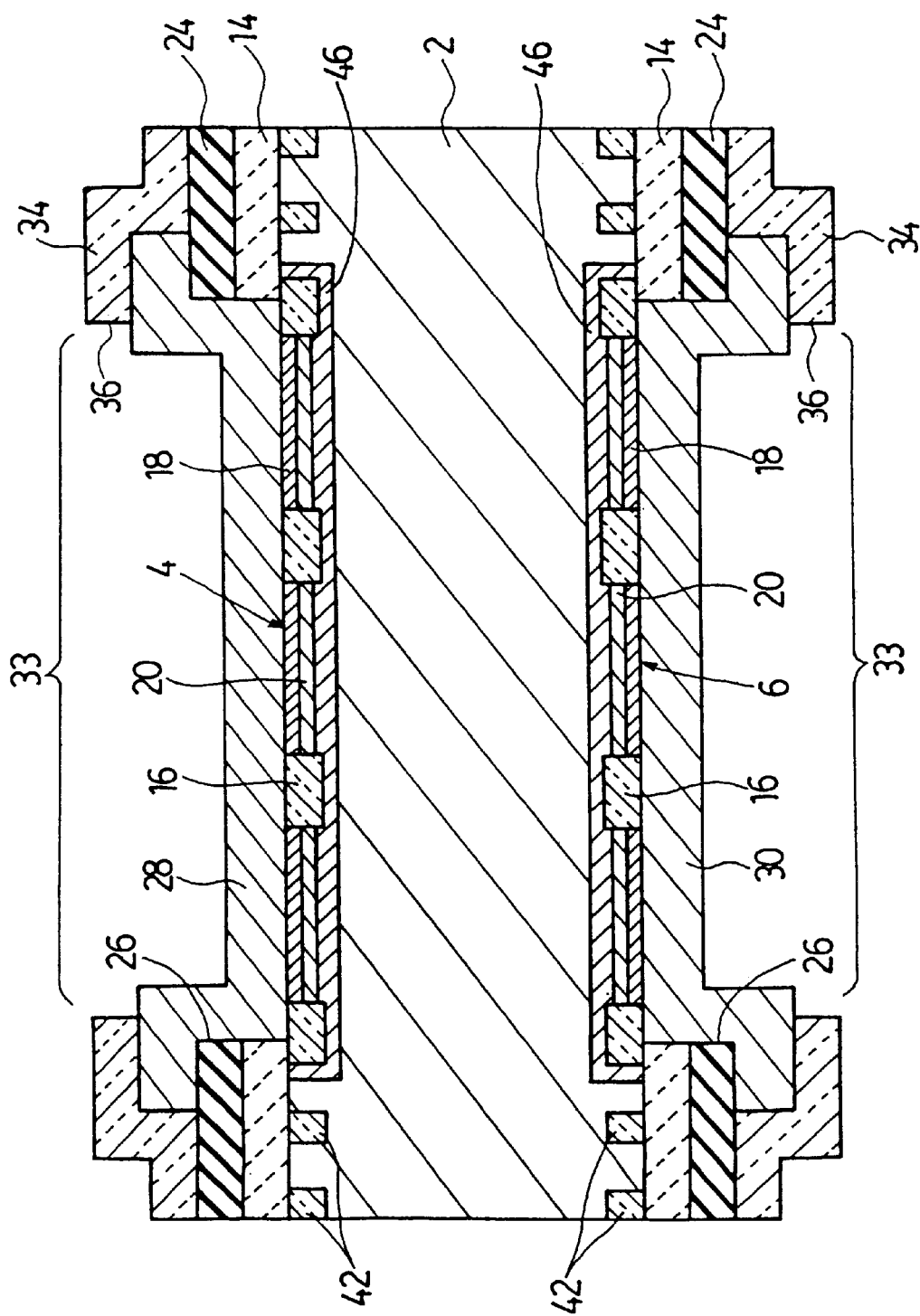
FIG. 1 is a sectional view showing the construction of a surge protection device according to a first embodiment of the invention.
Figure 30:
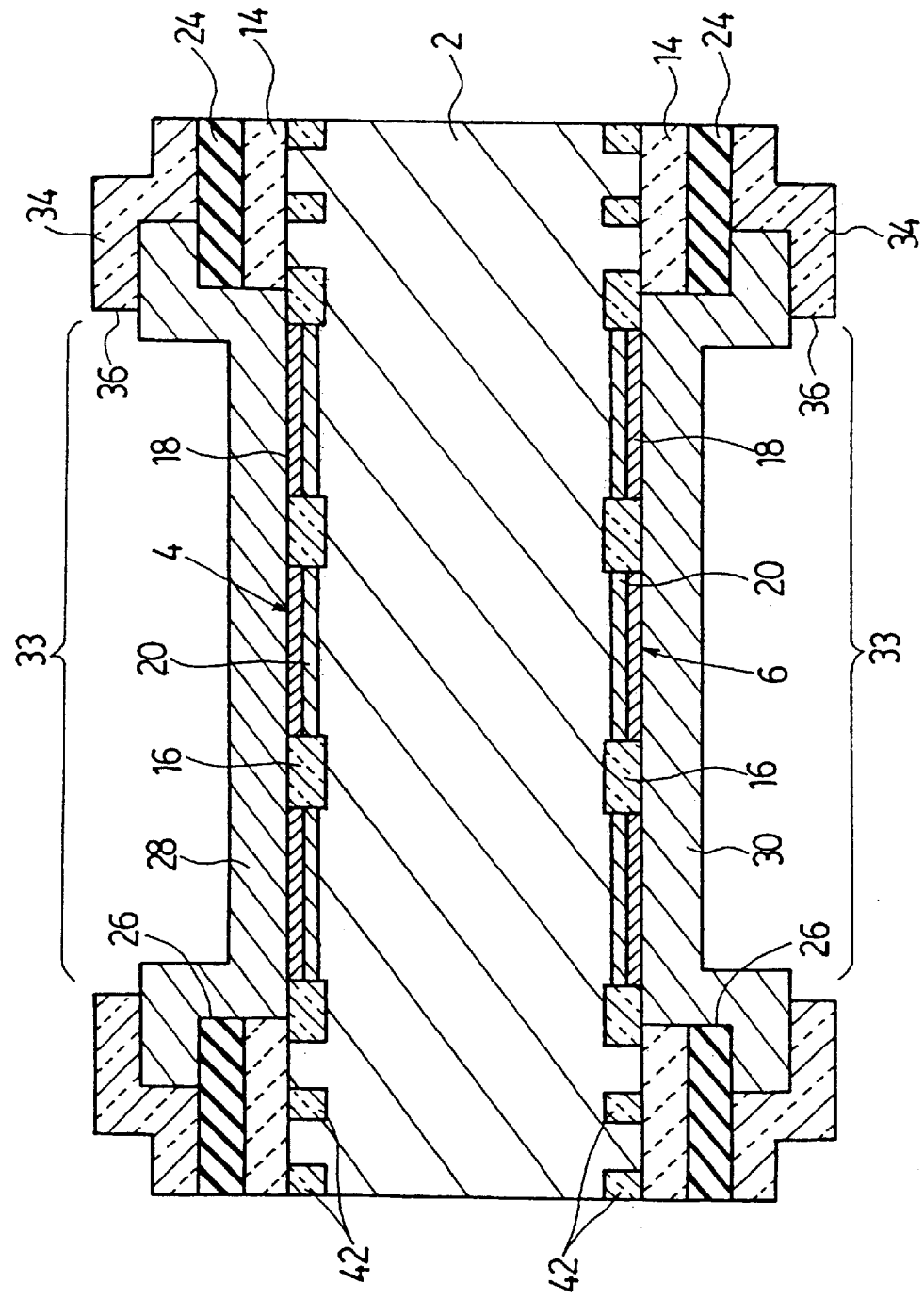
Figure 31:
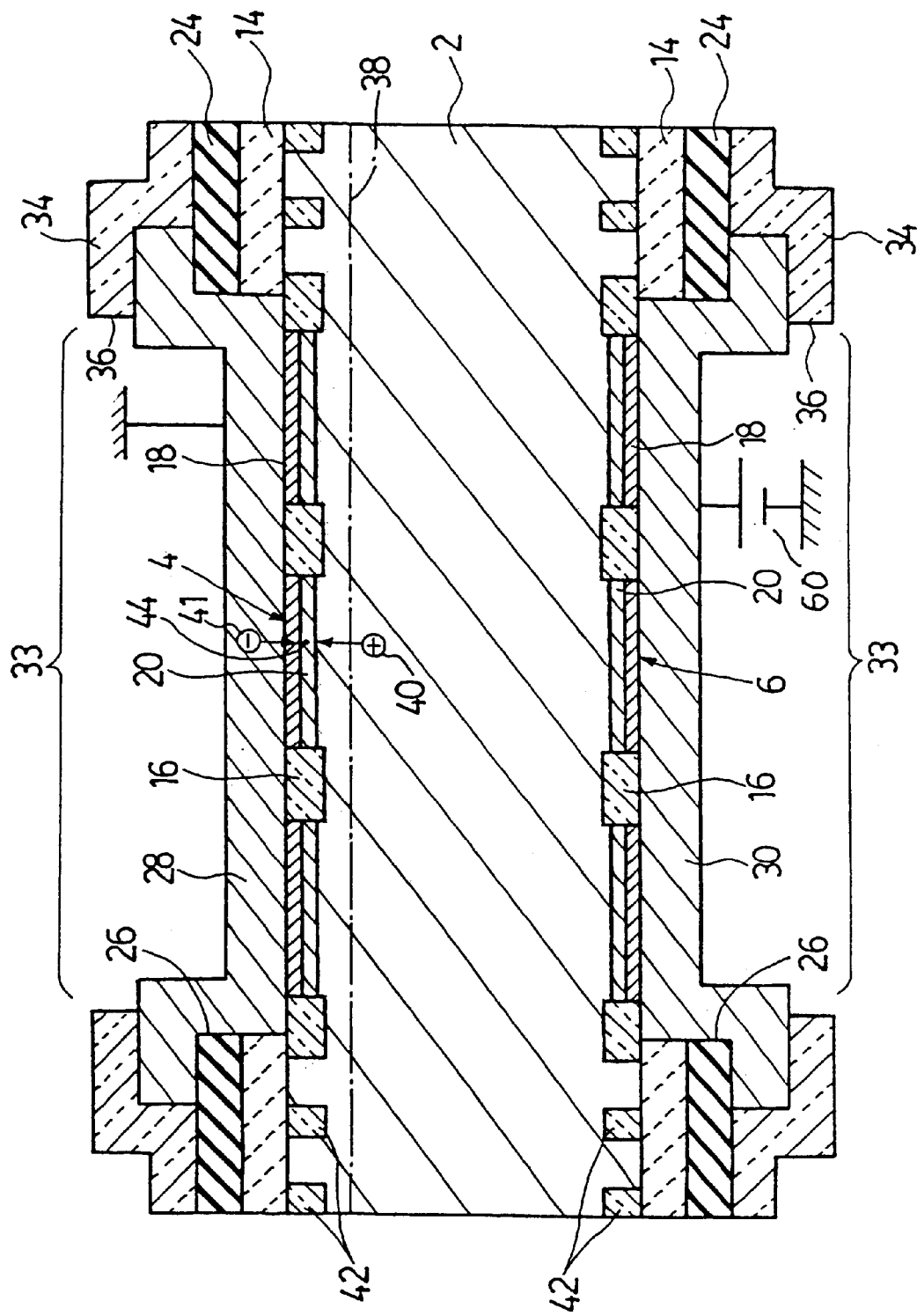
FIG. 31 is a sectional view showing the construction of the conventional finished surge protection device.
Figure 32:
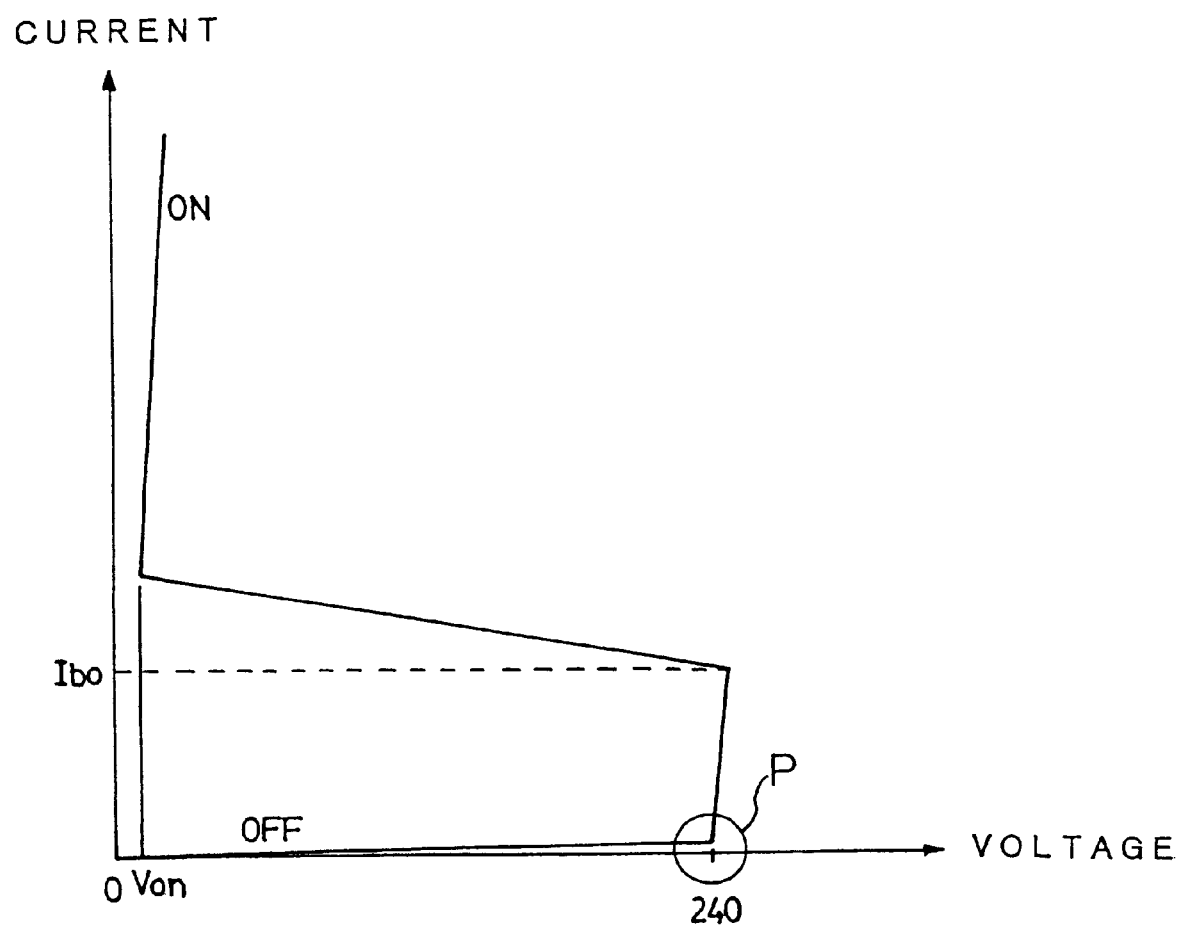
FIG. 32 is a view showing the operation principle of a surge protection device utilizing a punch-thorough phenomenon in a semiconductor.
Figure 33:
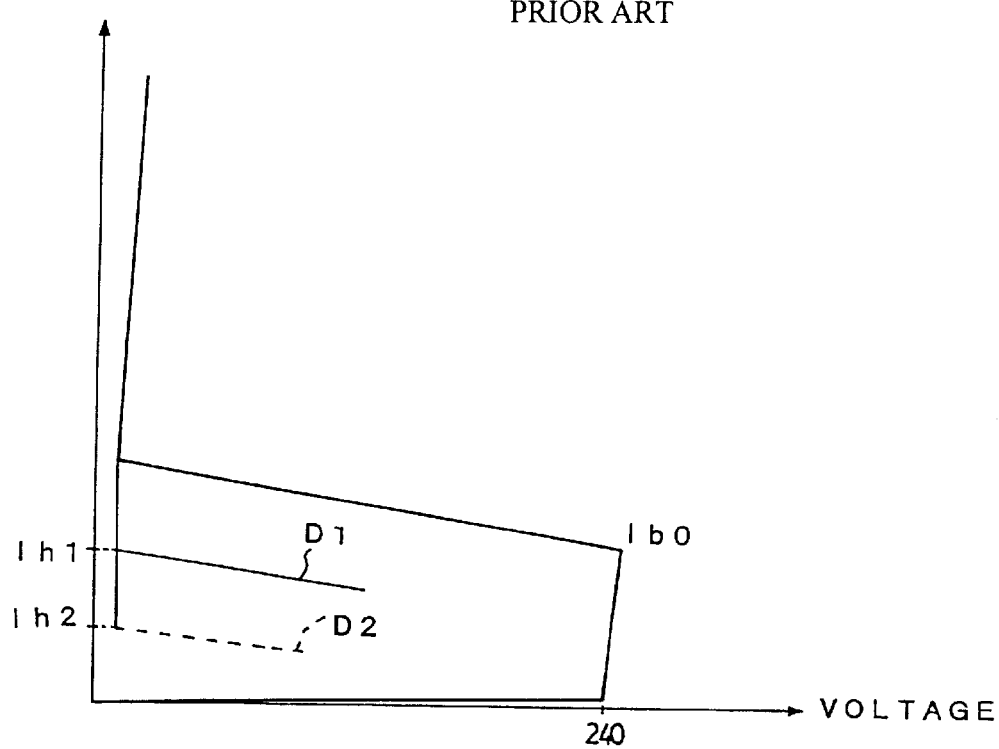
FIG. 33 is a view showing current-voltage characteristics of a conventional directional surge protection device and a bidirectional surge protection device; and, FIG. 34 is a sectional view partly enlarging a conventional bidirectional surge protection device for explaining the reason why a holding current is lowered.
Figure 34:
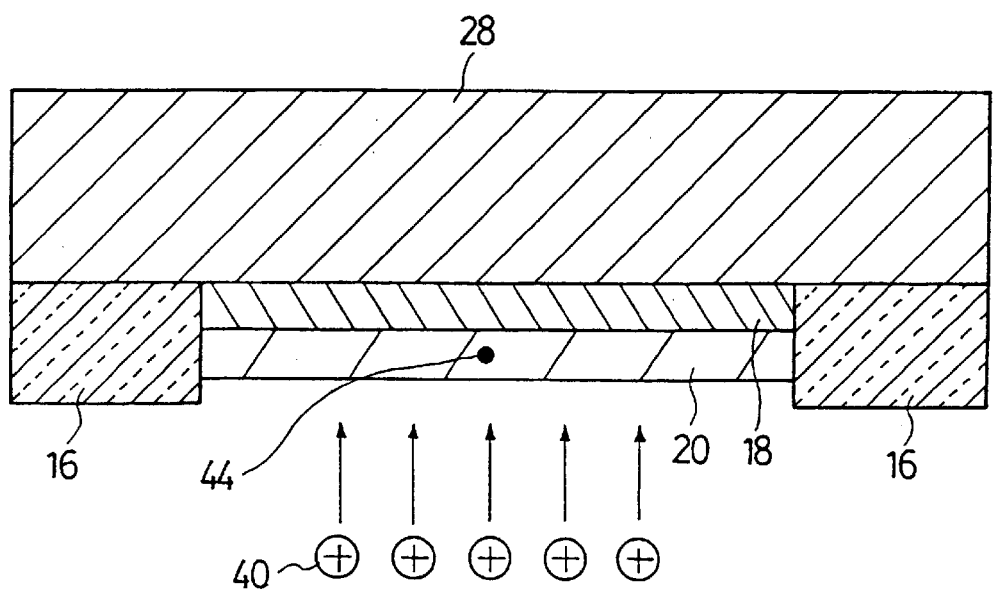

A surge protection device in the First Embodiment (FIG. 1):

The construction of a surge protection device according to the first embodiment of the invention will be described with reference to the sectional view of FIG. 1. In FIG. 1, components which are the same as those in FIG. 30 are denoted by the same numerals. Each following drawing is the same way.

As shown in FIG. 1, base layers 20 are selectively formed on both surfaces, namely, a front surface 4 and a back surface 6 of a semiconductor substrate 2 for determining a voltage at which the device becomes ON and emitter layers 18 are formed only on the upper portions alone of the base layers 20 to determine the width of the base layers 20 and to inject minority carriers into the base layers 20 after the device becomes ON.

Stage differences of diffusion layers are generated at end portions of the base layers 20 when the emitter layers 18 are diffused and formed when the base layers 20 and the emitter layers 18 are only formed (this is called an emitter-push). An electric field is concentrated in these portions where the operation of the device is not performed uniformly over the entire surfaces of the base layers 20.

There are formed emitter-push restraining layers 16 on both sides of the base layers 20 and the emitter layers 18 provided on both surfaces of the semiconductor substrate 2, wherein the emitter-push restraining layers 16 are higher in impurity concentration than the base layers 20 and have the same conduction type as the base layers 20, thereby removing the stage differences of diffusion layers. The base layers 20, the emitter layers 18, and emitter-push restraining layers 16 formed on both surfaces of the semiconductor substrate 2 are collectively defined as device regions 33.

In the construction of the first embodiment, buried layers 46 are formed on the entire lower surfaces of the device regions 33 formed on both surfaces of the semiconductor substrate 2 wherein the buried layers 46 have the same conduction type as the semiconductor substrate 2 and have a high impurity concentration.

Electric field relaxation layers 42 are formed on both surfaces of the semiconductor substrate 2 to surround the buried layers 46 for keeping a sufficient withstand voltage so as to avoid break down in a lateral direction.

LOCOS films 14, 14 are selectively formed on both surfaces of the semiconductor substrate 2 for separating the device regions 33 from other regions, and PSG films 24, 24 as interlayer insulators are formed on the LOCOS films 14 provided on both surfaces of the semiconductor substrate 2 to lighten the influence of the electric field to be applied to the metal electrode end portions.

Contact holes 26, 26 are formed in both surfaces of the semiconductor substrate 2 so as to secure the connection between the metal electrodes and the device regions 33, and a front metal electrode 28 and a back metal electrode 30 are respectively formed in the contact holes 26, 26 to overlap on the PSG films 24 at parts thereof.

Passivation films 34, 34 are formed on the front metal electrode 28 and the back metal electrode 30 provided on both surfaces of the semiconductor substrate 2 for protecting the device from the external environment and to secure reliability of the device, and openings 36 of the passivation films 34 are formed at the portion corresponding to the device regions 33 considering the subsequent mounting thereof, described later. Accordingly, the passivation films 34 are provided at the peripheries of the device regions 33 provided on both surfaces of the semiconductor substrate 2.

Although the conduction type of respective components of the semiconductor are not defined in the aforementioned explanation, if the conduction type of the semiconductor substrate 2 is n-type, the buried layers 46 and the emitter layers 18 are respectively n-type while the emitter-push restraining layers 16, the electric field relaxation layers 42, and the base layers 20 are respectively p-type.

Additionally, if the conduction type of the semiconductor substrate 2 is p-type, the buried layers 46 and the emitter layers 18 are respectively p-type while the emitter-push restraining layers 16, the electric field relaxation layers 42, and the base layers 20 are respectively n-type.

Next, the operation of the surge protection device will be now be described.

The basic operation of this surge protection device is the same as the conventional surge protection device shown in FIG. 30. It is a problem that the injection of minority carriers lowers the holding current.

According to the construction of the surge protection device of the first embodiment, the buried layers 46, which are the same conduction type as the semiconductor substrate 2 and have high impurity concentration, are provided on the entire lower surfaces of the device regions 33. Accordingly, the injection of minority carriers from the surface opposite to the surface on which the device operates decreases, and the potentials of the base layers quickly become low when the device is switched from ON to OFF, thereby rendering the holding current high.

A method of fabricating the surge protection device according to the first embodiment (FIGS. 1 to 12):

Next, a method of fabricating the surge protection device shown in FIG. 1 according to the first embodiment will be now described with reference to FIGS. 1 to 12.

Described in the method of fabricating the surge protection device is a case where the device, namely, the surge protection device, is fabricated under the condition that it is to operate at 240 V and employs an n-type semiconductor substrate having an impurity concentration level of $10^{14}$ atoms/cm$^3$.

Pad oxidation films 8 made of a silicon oxide film are formed on both surfaces of the semiconductor substrate 2, namely on the front surface 4 and the back surface 6, in a thickness of 40 nm at 1000° C., with a flow rate of O$_2$/N$_2$=9.4/2.6 liter/min., for 55 minutes using a diffusion furnace, for relaxing stress generated when forming the LOCOS films 14.

Subsequently, photoresists 53 each serving as a mask when implanting ions into both surfaces of the semiconductor substrate 2 are coated on all surfaces of the semiconductor substrate 2 and they are subject to patterning to perforate the device regions 33, and also phosphorus serving as an n-type impurity is implanted at a dose of $1.0 \times 10^{15}$ atoms/cm$^2$, with 80 KeV energy so that the device regions 33 are higher than the semiconductor substrate 2 in impurity concentration. Then, the photoresists 53 are removed from all surfaces.

Thereafter, the drive-in process is performed at 1140° C., five hours in a nitrogen atmosphere, thereby diffusing the implanted impurity in the semiconductor substrate 2 to form the n-type buried layers 46.

Subsequently, silicon nitride films used for forming LOCOS films are formed in a thickness of 150 nm at 780° C., with a flow rate of SiH$_2$Cl$_2$/NH$_3$=90/900 sccm, at 0.6 Torr for 42 minutes using a reduced pressure CVD device for the purpose of partially forming the LOCOS films made of silicon oxide film provided at both surfaces of the semiconductor substrate 2.

Figure 4:
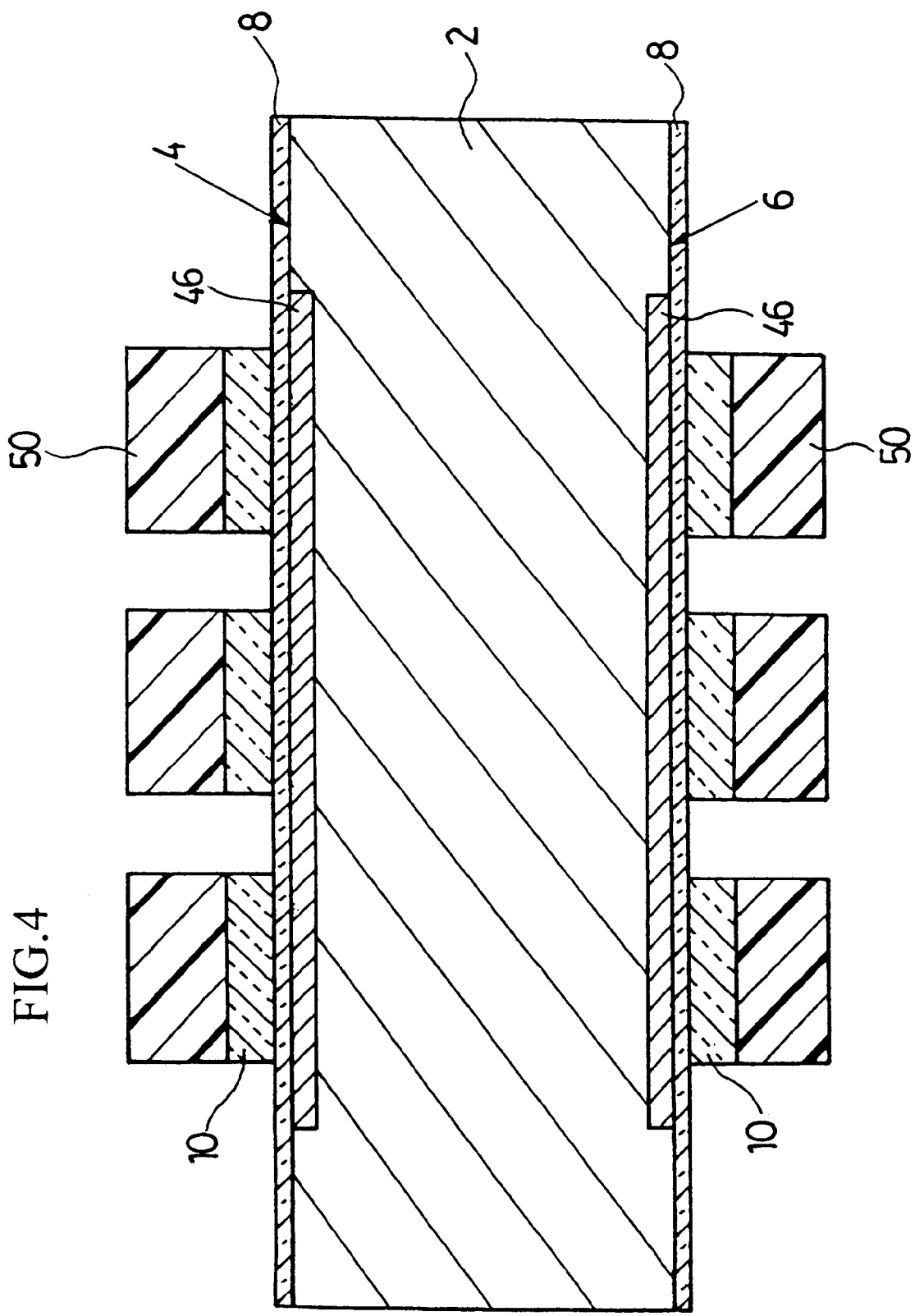

The photoresists 50 serving as an etching mask are entirely coated on both surfaces of the semiconductor substrate 2, and are then developed after being exposed using the photoresists 50 as a photo mask, followed by patterning as shown in FIG. 4.

Subsequently, the LOCOS film forming silicon nitride films 10 provided on both surfaces of the semiconductor substrate 2 are etched as shown in FIG. 4.

At this time, the LOCOS film forming silicon nitride films 10 are etched using sulfur hexafluoride (SF$_6$), helium(He) and methane trifluoride (CHF$_3$) in a parallel plate dry etching system having an RF power supply at 0.3 Torr for 1 minute so that the exposed part of the LOCOS film forming silicon nitride films 10 is removed along with the pattern of photoresists 50. Thereafter, the photoresists 50 are entirely peeled off.

Figure 5:
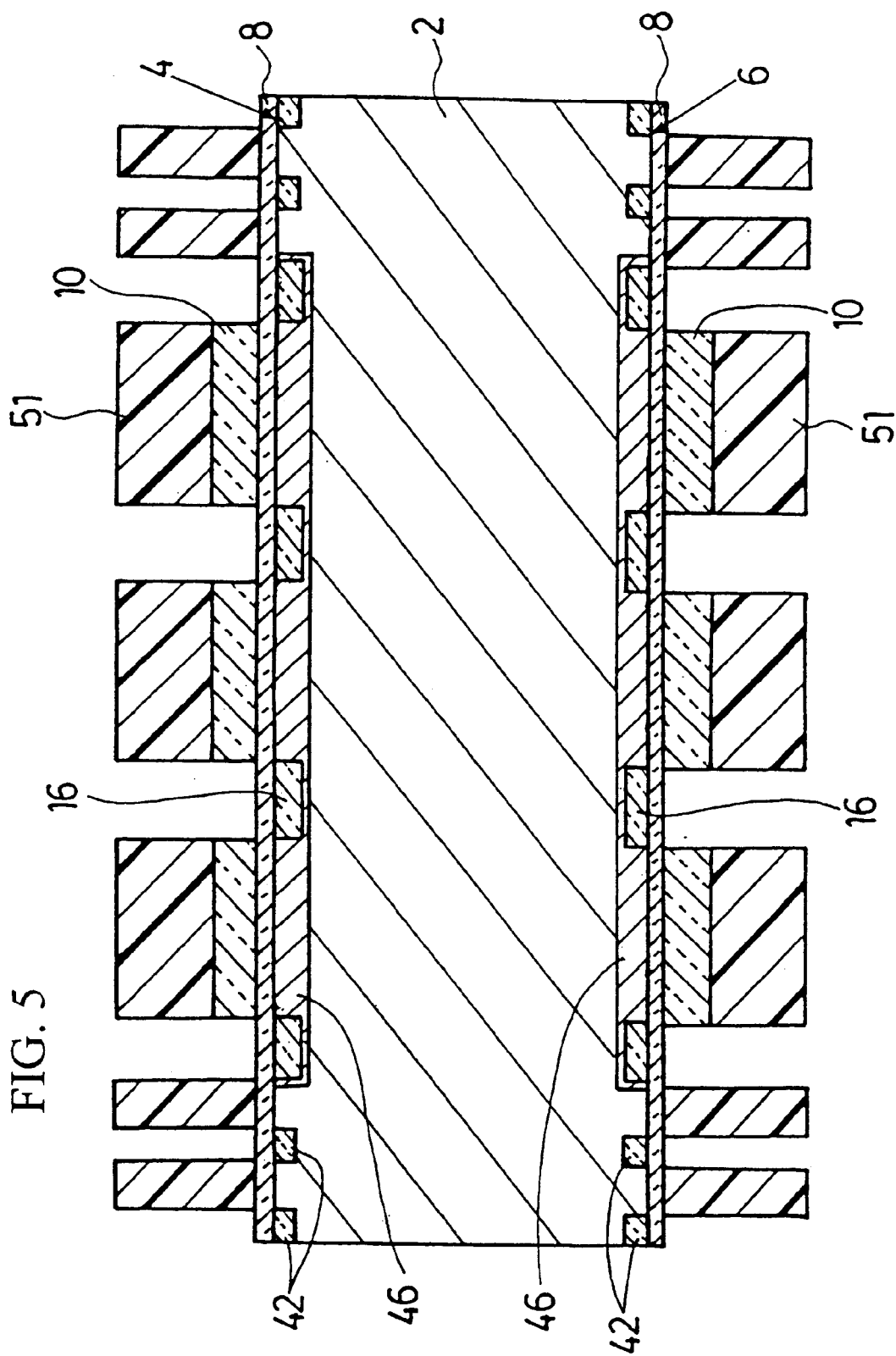

Then as shown in FIG. 5, photoresists 51 are coated on the entire surfaces (all surfaces) for perforating the region where the emitter-push restraining layers 16 and the electric field relaxation layers 42 are formed on both surfaces of the semiconductor substrate 2, then they are exposed and developed using the photomask, completing patterning.

Boron which is a p-type impurity is implanted in both surfaces of the n-type semiconductor substrate 2 using the photoresist 12 as an ion implantation mask at a dose of $1.0 \times 10^{15}$ atoms/cm$^2$ with 30 KeV energy. Then the photoresists 51 are removed.

Then, an oxidation is performed at 1140° C., with a flow rate of O$_2$/N$_2$=0.06/9.0 liter/min. for 20 minutes while the LOCOS film forming silicon nitride films 10 serve as an anitoxidation film, then the pad oxide films 8 are subject to oxidation at 1140° C. for 420 minutes in an oxygen atmosphere.

Figure 6:
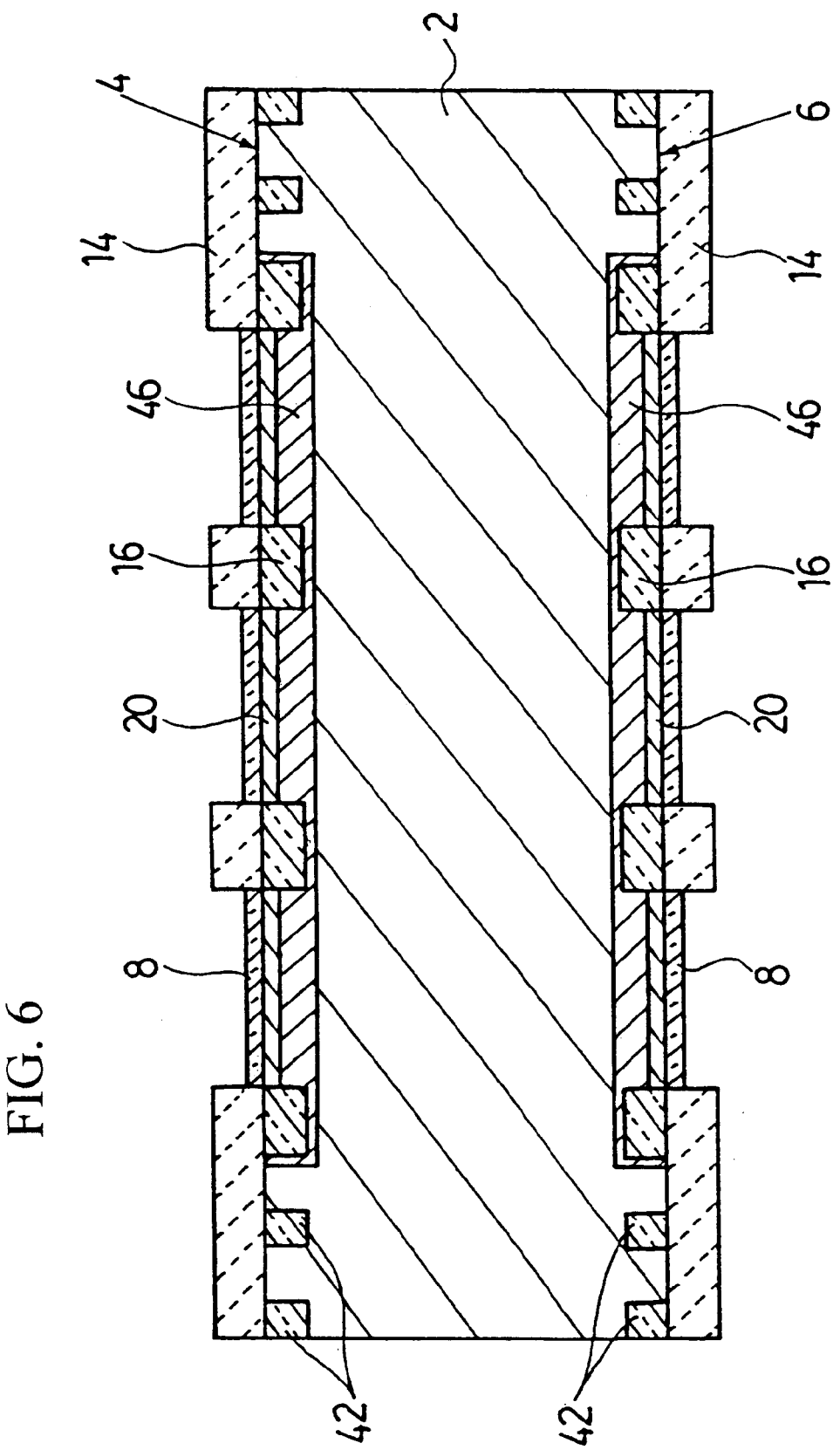

As a result, as shown in FIG. 6, the LOCOS films 14 are formed in a thickness of 500 nm as a separation insulator on the region where the LOCOS films forming silicon nitride films 10 are not formed.

The emitter-push restraining layers 16 formed to remove the stage differences of the diffusion layers, referred to as the emitter-push, which are generated at end portions of base layers, formed later, and the electric field relaxation layers 42 formed to surround the peripheries of the device regions 33 for allowing the device regions 33 to have adequate withstand voltage so as to avoid break down in the lateral direction of the device are respectively driven-in at the same time when forming the LOCOS films 14, so that the p-type impurity which is implanted in the n-type semiconductor substrate 2 is diffused and formed.

Figure 7:
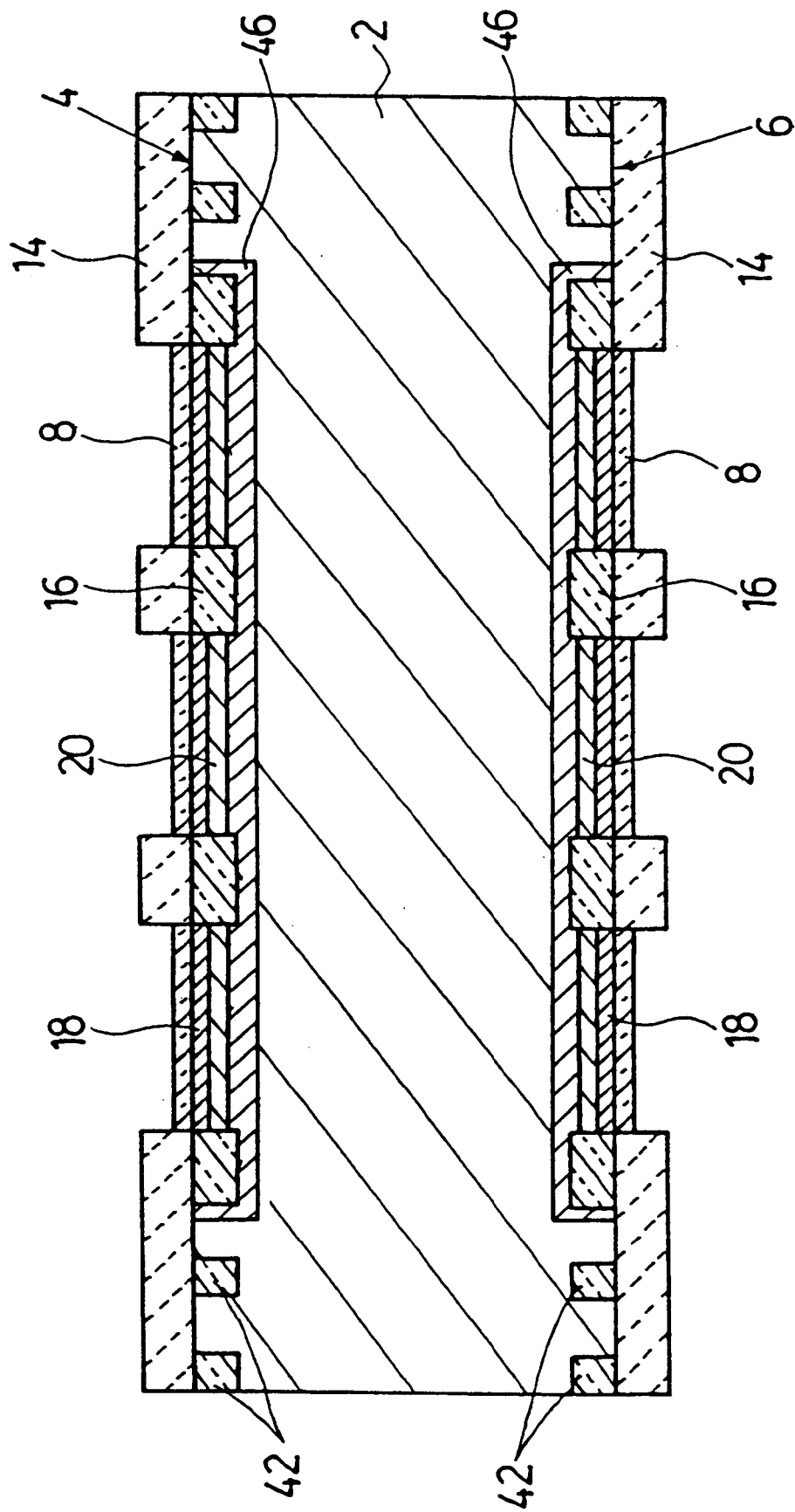

Then as shown in FIG. 7, boron which is a p-type impurity is implanted in both surfaces of the n-type semiconductor substrate 2 at a dose of $7.0 \times 10^{12}$ atoms/cm$^2$ with 60 KeV energy using the LOCOS films 14 as an ion implantation mask.

Thereafter, the p-type impurity which is implanted in both surfaces of the n-type semiconductor substrate 2 is diffused while the drive-in is performed at 1140° C. for 30 hours in a nitrogen atmosphere, so that the p-type base layers 20 are formed on the region where the LOCOS films 14 are not formed.

It is possible to determine the operation voltage of the device based on the width and the concentration of the p-type base layers 20.

Figure 8:
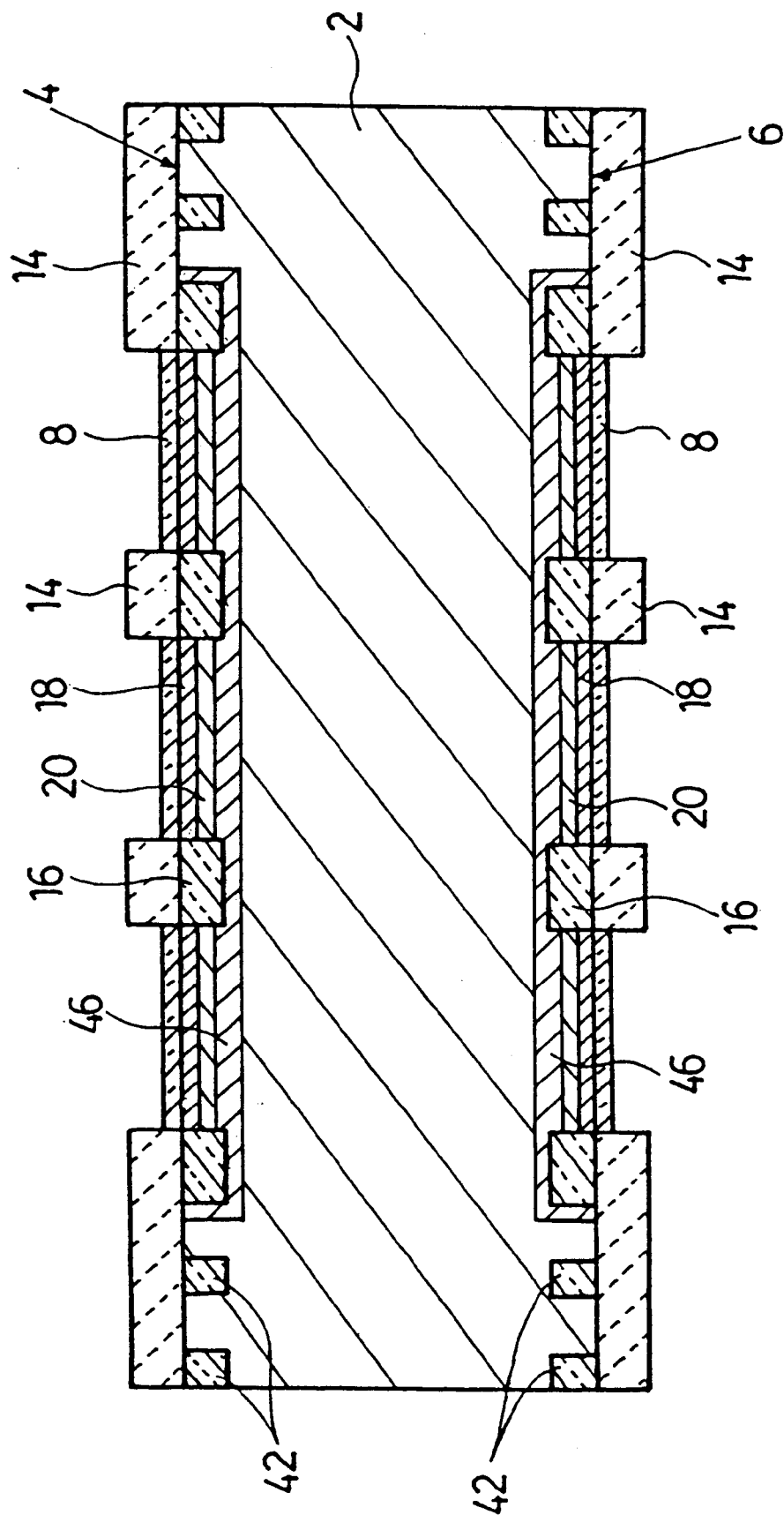

Subsequently, as shown in FIG. 8, phosphorus which is an n-type impurity is implanted in both surfaces of the n-type semiconductor substrate 2 at a dose of $5.5 \times 10^{15}$ atoms/cm$^2$ with 80 KeV energy using the LOCOS films 14 as an ion implantation mask.

Thereafter, phosphorus is processed at 1100° C. with a flow rate of O$_2$/N$_2$=0.45/8.55 liter/min. for 80 minutes, then it is further processed at 1140° C. for 20 minutes in an oxygen atmosphere followed by drive-in at 1140° C. for 10 minutes in a nitrogen atmosphere, thereby diffusing on both surfaces of the semiconductor substrate 2 to form the n-type emitter layers 18 on the upper portions alone of the p-type base layer 20.

Figure 9:
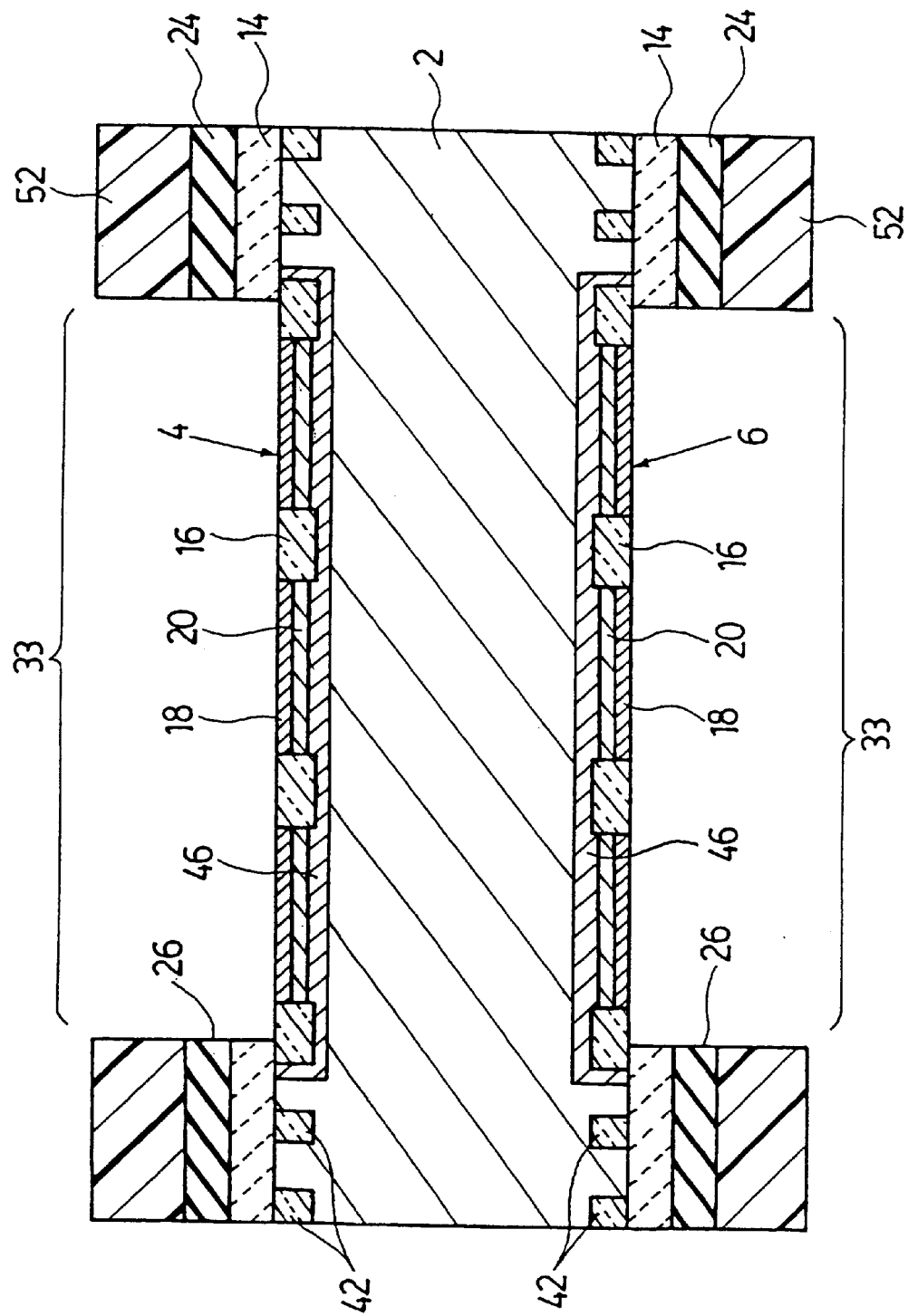

Thereafter, both surfaces of the semiconductor substrate 2 are processed at 460° C. for 1 minute using a mixed gas of phosphine (PH$_3$) and monosilane (SiH$_4$) by a thermal CVD process, thereby forming the PSG films 24 in a thickness of 500 nm as shown in FIG. 9 for reducing the influence of the electric filed applied to the boundary of the semiconductor substrate 2 and the LOCOS films 14 generated at the metal electrode portions.

Thereafter, photoresists 52 serving as an etching mask are coated on both entire surfaces of the semiconductor substrate 2, then they are exposed, followed by developing, to complete patterning. Then, they are processed for 11 minutes using a wet etching liquid of an ammonium fluoride solution, thereby forming the contact holes 26 on both surfaces of the semiconductor substrate 2. Thereafter, the photoresists 52 are peeled off entirely.

Figure 10:
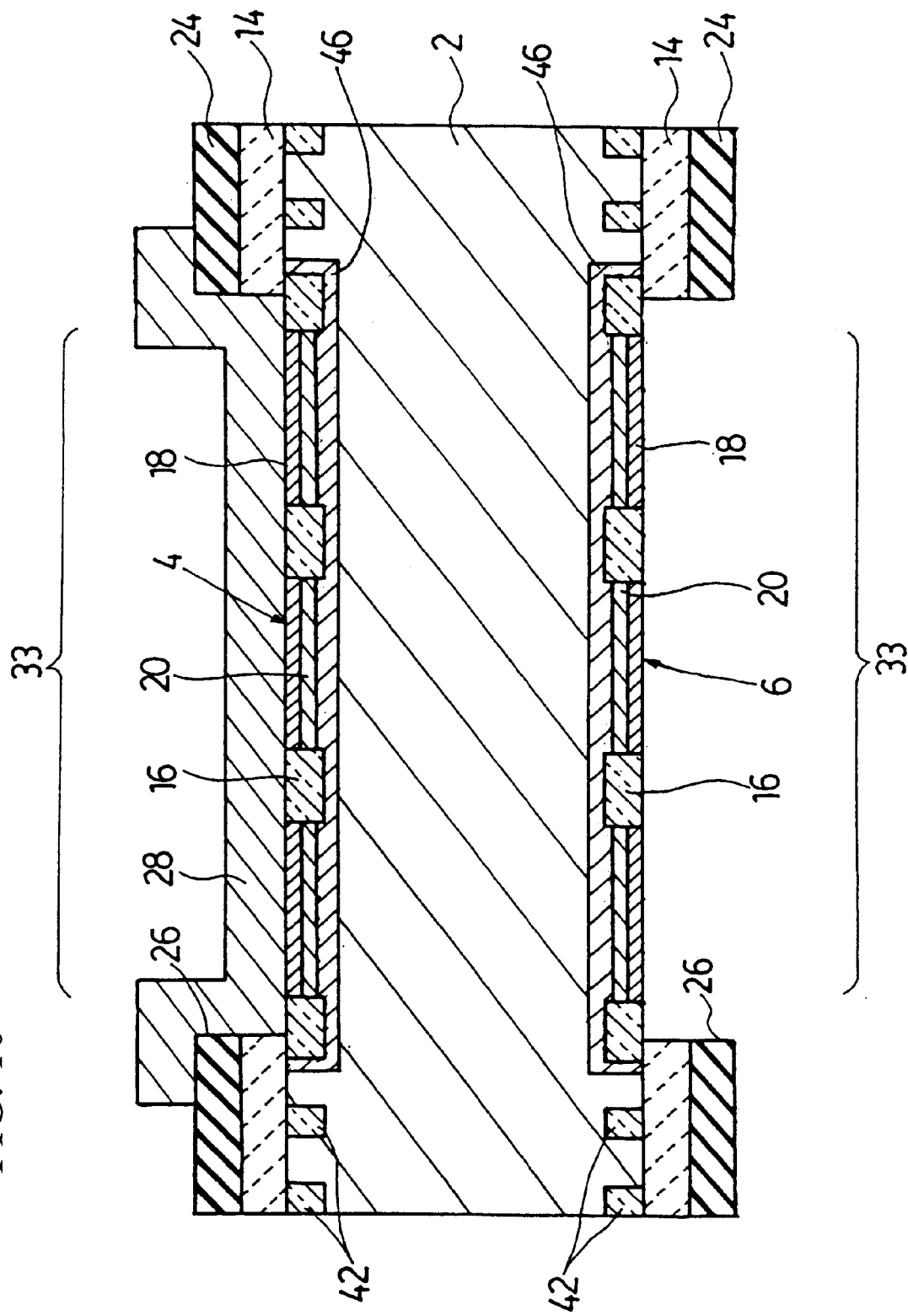

Subsequently, as shown in FIG. 10, a metallic material mainly composed of aluminum is formed on the front surface 4 of the semiconductor substrate 2 in a thickness of 1000 nm using a magnetron sputtering system. Then, a photoresist (not shown), is coated on the front surface 4 alone, and it is thereafter developed after being exposed, followed by patterning.

This photoresist is subject to etching for 5 minutes using a wet etching liquid which is formed by mixing phosphorus acid: nitric acid: acetic acid in a ratio of 15:1:3, thereby forming the front metal electrode 28 while it is used as a mask. Thereafter, the photoresist used as an etching mask is peeled off from the front surface 4.

Thereafter, the passivation films 34 made of a silicon nitride film are formed on the front surface 4 alone in a thickness of 800 nm using a plasma CVD.

Subsequently, a metallic material mainly composed of aluminum is formed on the back surface 6 of the semiconductor substrate 2 in the thickness of 1000 nm using a magnetron sputtering system. Then, a photoresist serving as an etching mask, (not shown), is coated on the back surface 6 alone, and thereafter it is developed after being exposed, followed by patterning.

Figure 11:
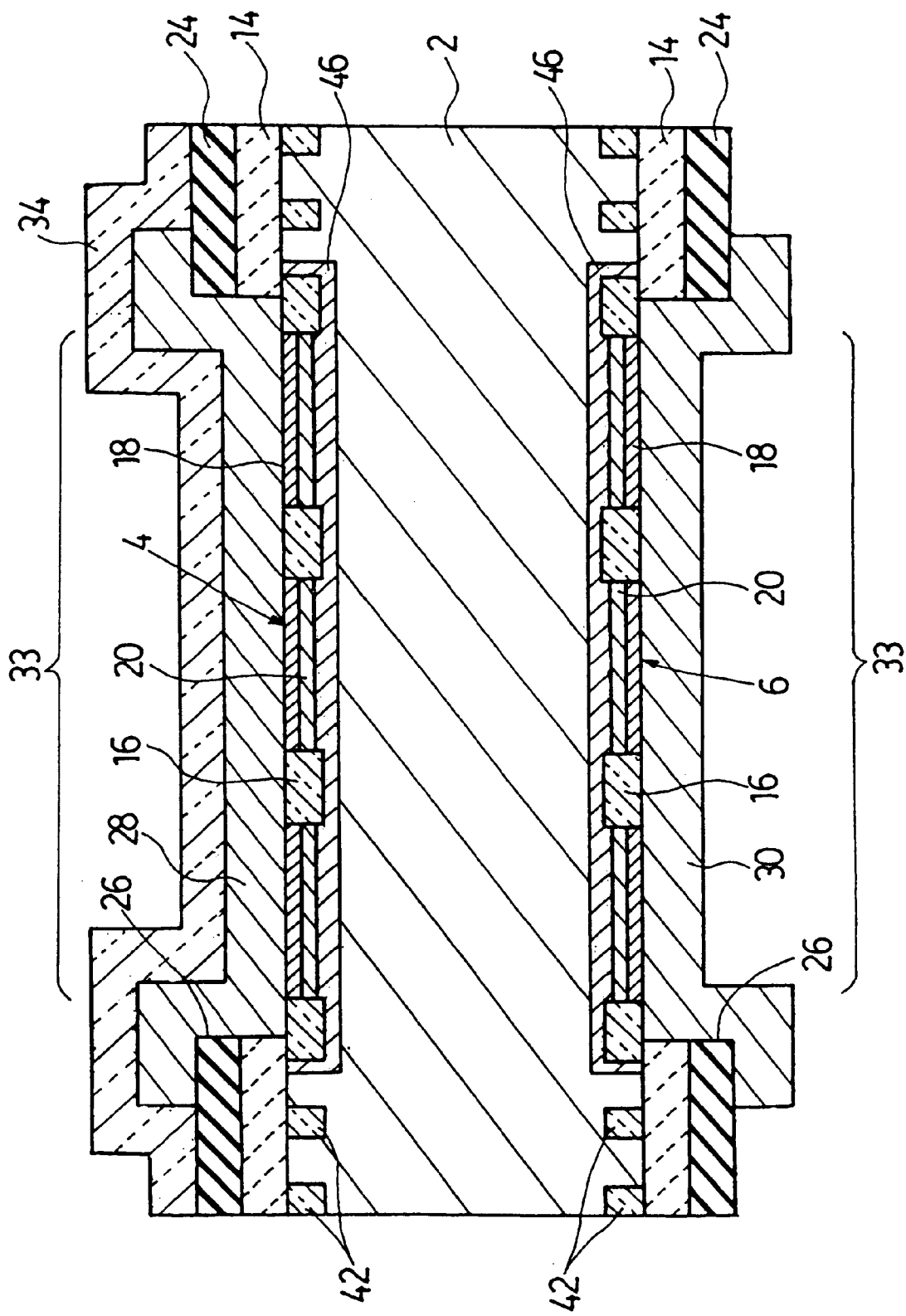

An etching is performed using this photoresist as an etching mask for 5 minutes using a wet etching liquid which is formed by mixing phosphorus acid: nitric acid: acetic acid in a ratio of 15:1:3, thereby forming the metal electrode 30 as shown in FIG. 11.

Thereafter, sintering is performed at 380° C. for 60 minutes in a hydrogen atmosphere so that silicon of the semiconductor substrate 2 and the metallic material are fused to lower a resistance.

Figure 12:
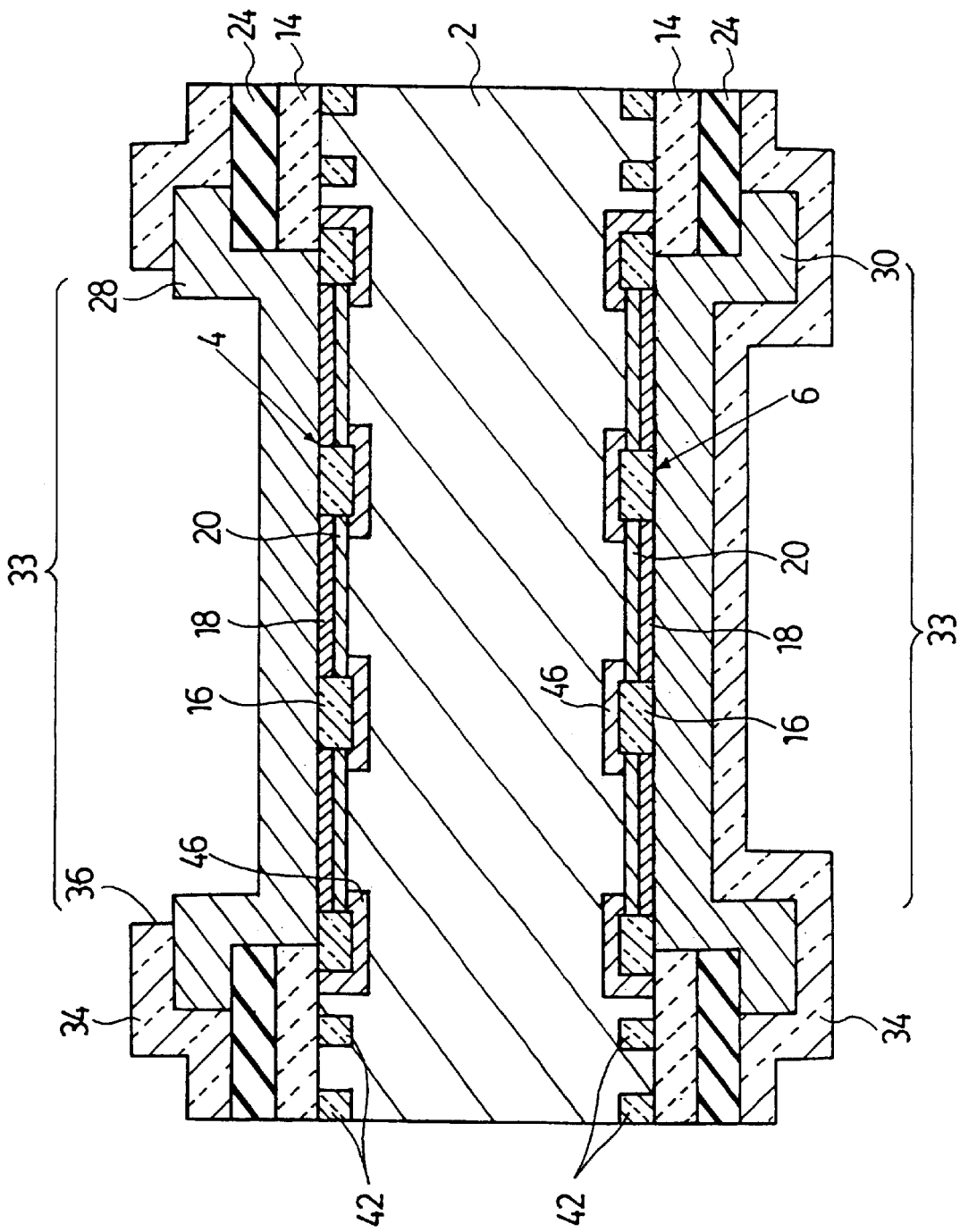

Thereafter, as shown in FIG. 12, the passivation films 34 made of silicon nitride film are formed on the entire back surface 6 alone of the semiconductor substrate 2 in a thickness of 800 nm by a plasma CVD. The passivation films 34 are provided for protecting the device against the external environment.

Thereafter, a photoresist serving as an etching mask is coated on the front surface 4 alone of the semiconductor substrate 2, then it is developed after being exposed using a photomask, followed by patterning.

At this time, the etching is performed using a mixed gas of carbon tetrafluroride ($CF_4$) and oxygen ($O_2$) in a parallel plate dry etching system employing an RF power supply at a pressure of 0.5 Torr for 1 minute and 30 seconds. As a result, the exposed part of the passivation films 34 are removed along the pattern of the photoresist, thereby defining the openings 36 corresponding to device region 33 in the passivation films 34 at the front surface as shown in FIG. 12. Thereafter the photoresists are entirely peeled off.

Then, a photoresist serving again as an etching mask is coated on the back surface 6 alone of the semiconductor substrate 2, and it is developed after exposed using a photomask, followed by patterning.

Subsequently, the etching is performed using a mixed gas of carbon tetrafluoride ($CF_4$) and oxygen ($O_2$) in a parallel plate dry etching system employing a high RF power supply at a pressure of 0.5 Torr for 1 minute and 30 seconds. As a result, the exposed part of the passivation films 34 are removed along the pattern of photoresist, thereby forming the openings 36 corresponding to the device regions in the passivasion films 34 at the back surface as shown in FIG. 1. Thereafter, the photoresists are entirely peeled off.

In the above first embodiment, the n-type buried layers 46, the p-type emitter-push restraining layers 16, the p-type electric field relaxation layers 42, the n-type emitter restraining layers 18, and the p-type base layers 20, are respectively formed on both surfaces of the n-type semiconductor substrate 2.

However, if a p-type semiconductor substrate is used as the semiconductor substrate 2, a p-type surge protection device having the p-type semiconductor substrate 2 can be fabricated if the p-type buried layers 46, the n-type emitter push restraining layers 16, the electric field relaxation layers, the p-type emitter layers 18, and the n-type base layers 20 are respectively formed on both surfaces of the semiconductor substrate 2.

Still further, although the PSG films 24 are formed by a thermal CVD as the insulating film to be formed on the LOCOS films 14 according to the method of fabricating the surge protection device of the first embodiment, a BPSG film or a laminated film of a BPSG film and a PSG film as the insulators can be formed.

Still further, although the front metal electrode 28, the back metal electrode 30, and the passivation film 34 are respectively individually formed on one side of the surge protection device according to the first embodiment in view of the problem in manufacturing system, the number of processes can be reduced if a system capable of forming these films simultaneously at both surfaces of the semiconductor substrate 2 can be fabricated.

Further more, although the first embodiment is explained under the condition that the operation voltage of the surge protection device is to be 240 V, it is possible to fabricate a device which operates at a different voltage if the fabricating conditions of the base layers 20 and the emitter layers 18 are changed and the diffusion depths thereof are changed.

Figure 13:
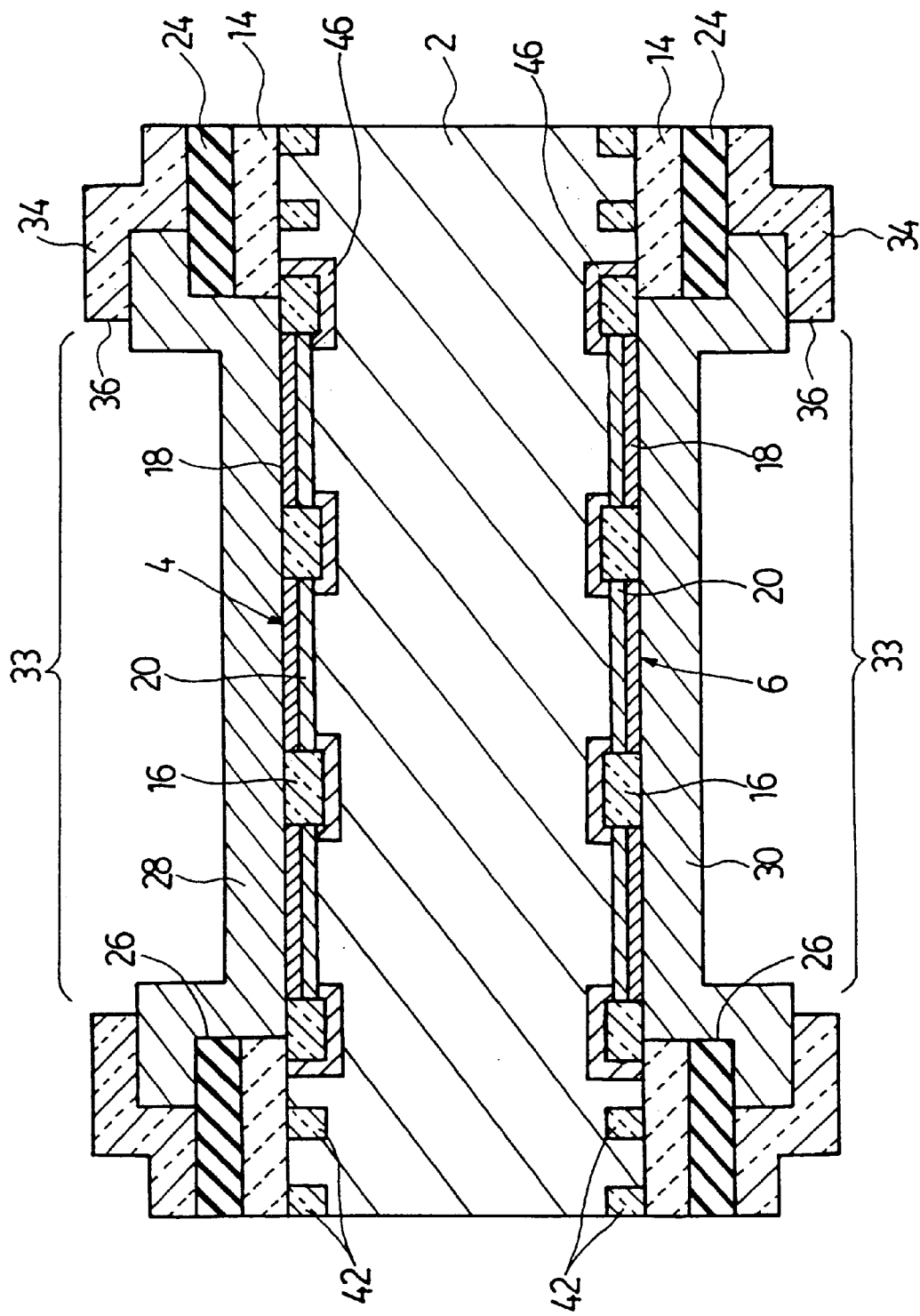
FIG. 13 is a sectional view showing the construction of a surge protection device according to a second embodiment of the invention.

A surge protection device according to a second embodiment (FIG. 13):

Next, the construction of a surge protection device according to a second embodiment will be now described with reference to the sectional view of FIG. 13. In FIG. 13, components which are the same as those of FIG. 1 are denoted by the same numerals. However, the shapes of the buried layers 46 therebetween are different from each other.

The surge protection device according to the second embodiment as shown in FIG. 13 is different from that of the first embodiment in that the buried layers 46 which are formed for restraining the injection of minority carriers in the semiconductor substrate 2 and are higher in impurity concentration than the semiconductor substrate 2 are formed under the emitter-push restraining layers 16 alone at both surfaces of the semiconductor substrate 2. Other components are the same as those of the first embodiment, and hence the explanation thereof is omitted.

The reason why the holding current is lowered is because of the large amount of injection of minority carriers from the surface opposite to the surface of the semiconductor substrate 2 on which the device operates, particularly it is caused by a large amount of injection of minority carriers from the emitter-push restraining layers 16 of a conduction type opposite to that of the semiconductor substrate 2 and having a higher impurity concentration.

Accordingly, it is possible to restrain the amount of injection of minority carriers from the surface opposite to the surface of the semiconductor substrate 2 on which the device operates even if the buried layers 46 which have the same conduction type as the semiconductor substrate 2 and are higher in impurity concentration than the semiconductor substrate 2 are formed under the emitter push restraining layers 16 alone, so that the surge protection device easily becomes OFF and the holding current becomes high.

Since the surge protection device is of a bidirectional design, the device operates on either the front surface 4 or back surface 6 in response to the polarity of a voltage to be applied.

Although the conduction type of respective components of the semiconductor in the second embodiment is not defined, the buried layers 46 and the emitter layers 18 are respectively n-type if the conduction of the semiconductor substrate 2 is n-type, while the emitter-push restraining layers 16, the electric field relaxation layers 42, and the base layers 20 are respectively p-type.

If the conduction type of the semiconductor substrate 2 is p-type, the buried layers 46, and the emitter layers 18 are respectively p-type while the emitter push restraining layers 16, electric field relaxation layers 42, and the base layers 20 are respectively n-type.

A method of fabricating the surge protection device according to the second embodiment (FIG. 2 and FIGS. 3 to 23):

Next, a method of manufacturing the surge protection device shown in FIG. 13 will be now described as the second embodiment.

Described in the method of fabricating the surge protection device is a case where the surge protection device operates at 240 V and employs an n-type semiconductor substrate 2 having an impurity concentration level of $10^{14}$ atoms/cm$^3$.

Figure 2:
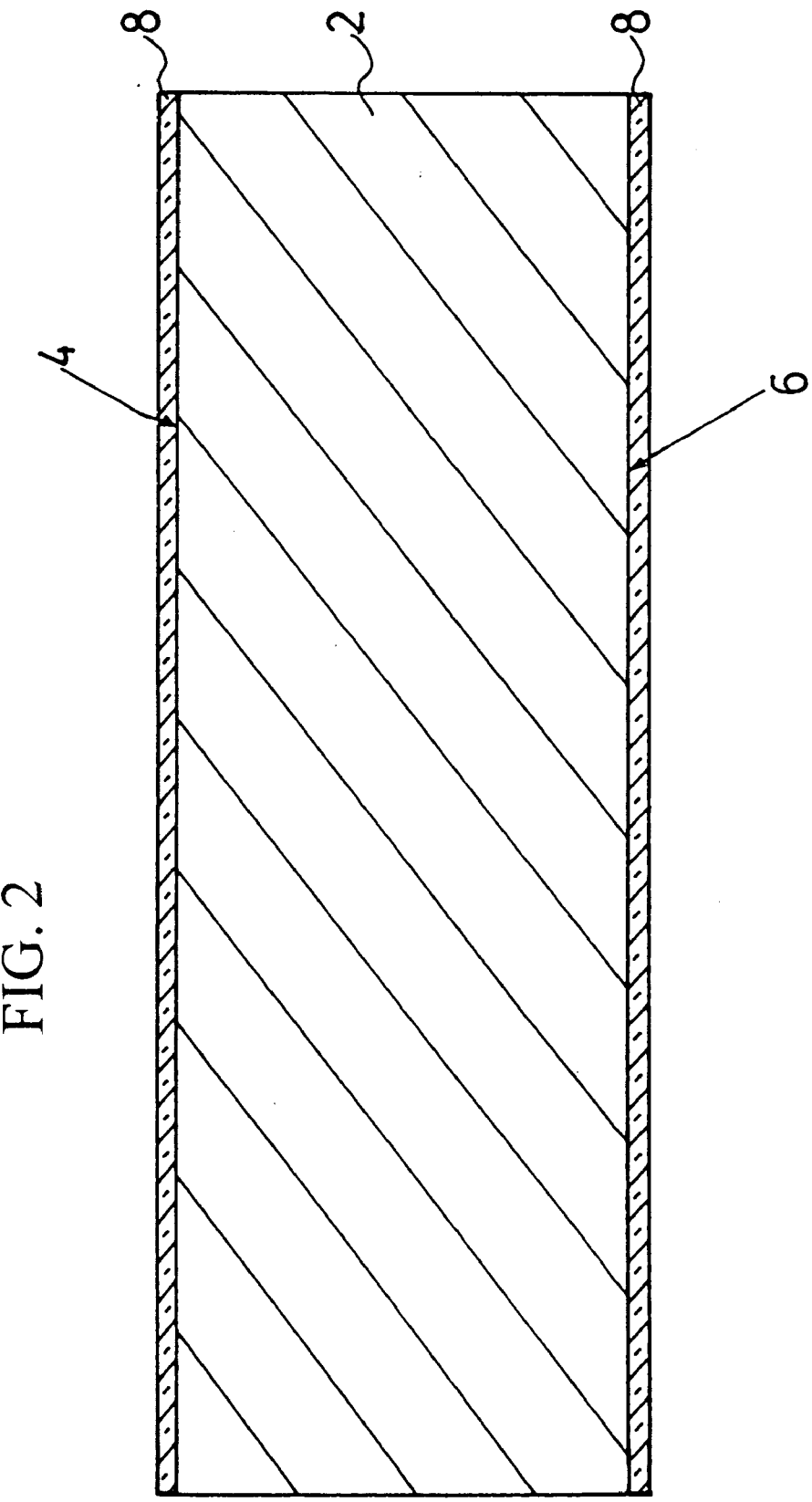
FIGS. 2 to 12 are sectional views respectively showing each step of a method of fabricating the surge protection device according to the first embodiment of the invention.
Figure 3:
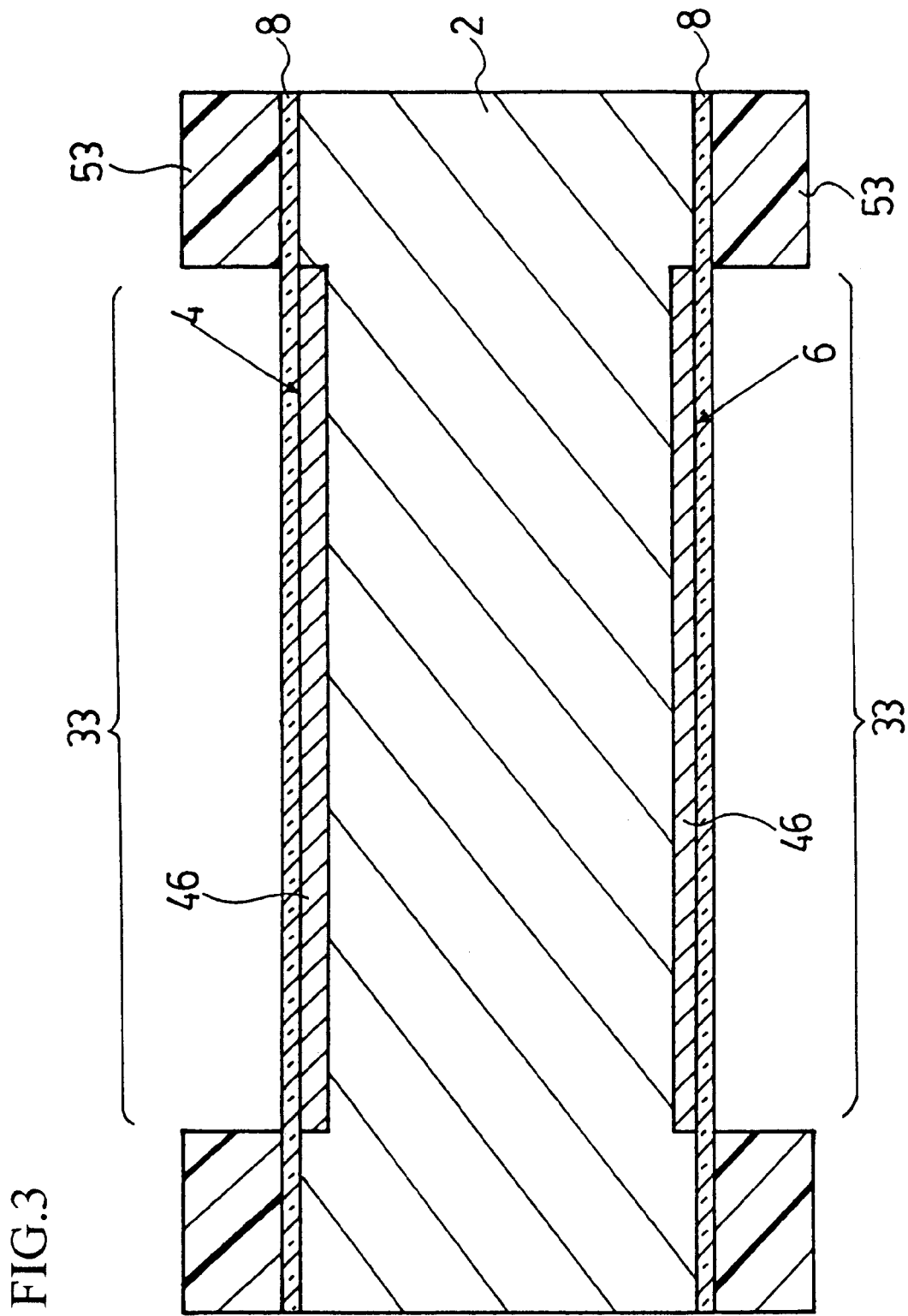

Even in the second embodiment, an oxidation is performed on both the front surface 4 and the back surface 6 of the n-type semiconductor substrate 2 shown in FIG. 2 using a diffusion furnace at 1000° C. with the rate of $O_2/N_2=9.4/2.6$ liter/min. for 55 minutes, thereby forming pad oxidation films 8 made of a silicon oxide film in a thickness of 40 nm.

Figure 14:
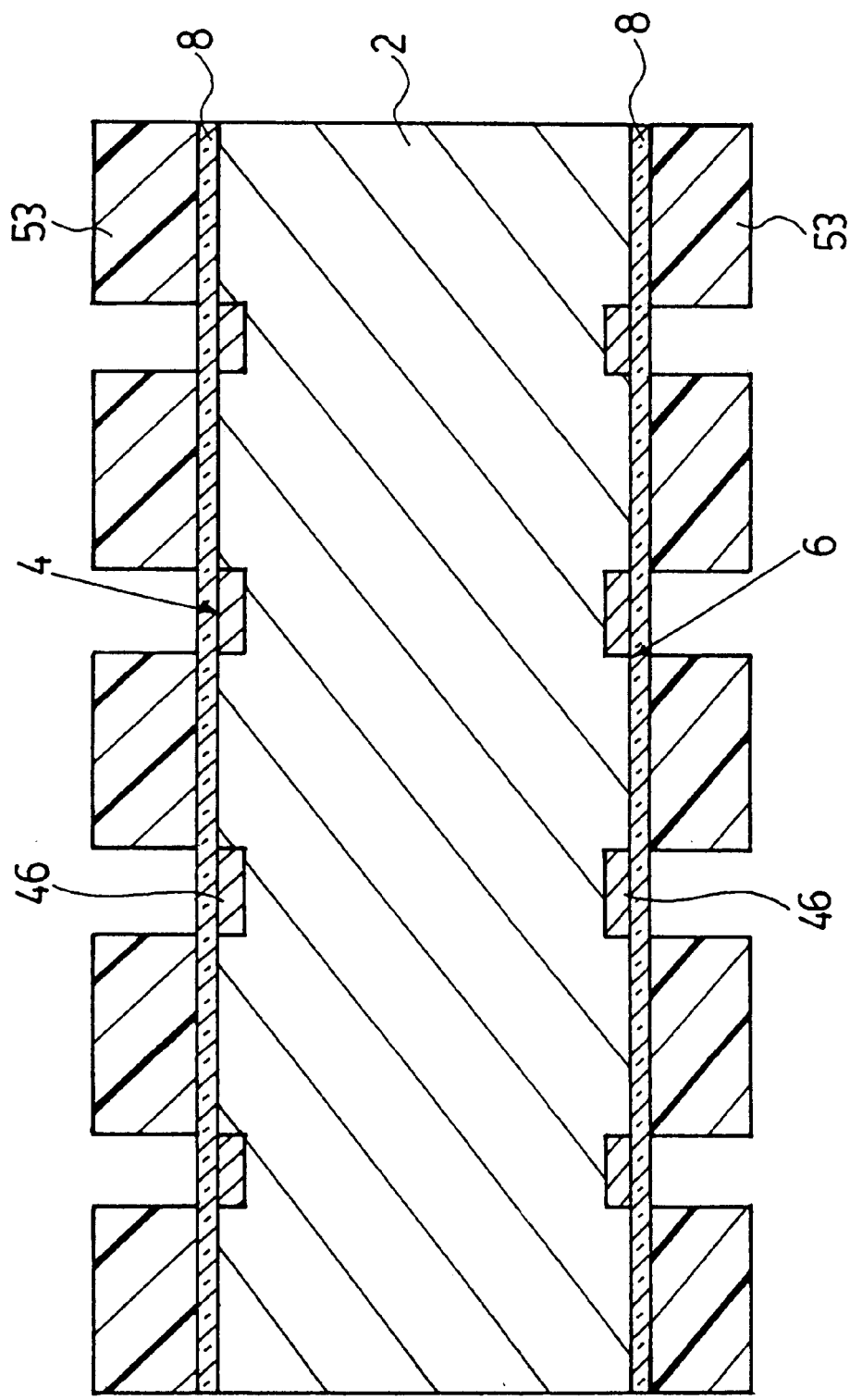
FIGS. 14 to 23 are sectional views respectively showing each step of a method of fabricating the surge protection device according to the second embodiment of the invention.

Subsequently, as shown in FIG. 14, photoresists 53 each serving as a mask when implanting ions into both surfaces of the n-type semiconductor substrate 2 are coated on entire surfaces of the semiconductor substrate 2 and they are subject to patterning to perforate the portion where the buried layers 46 are formed. Then, phosphorus serving as an n-type impurity is implanted at a dose of $1.0\times10^{15}$ atoms/cm$^2$, with 80 KeV energy so that the buried layers 46 are to be formed is higher than the semiconductor substrate 2 in impurity concentration. Then, the photoresists 53 are removed from the entire surfaces.

Thereafter, the drive-in process is performed at 1140° C. for five hours in a nitrogen atmosphere, thereby diffusing the implanted impurity in the semiconductor substrate 2 to form the n-type buried layers 46.

Figure 15:
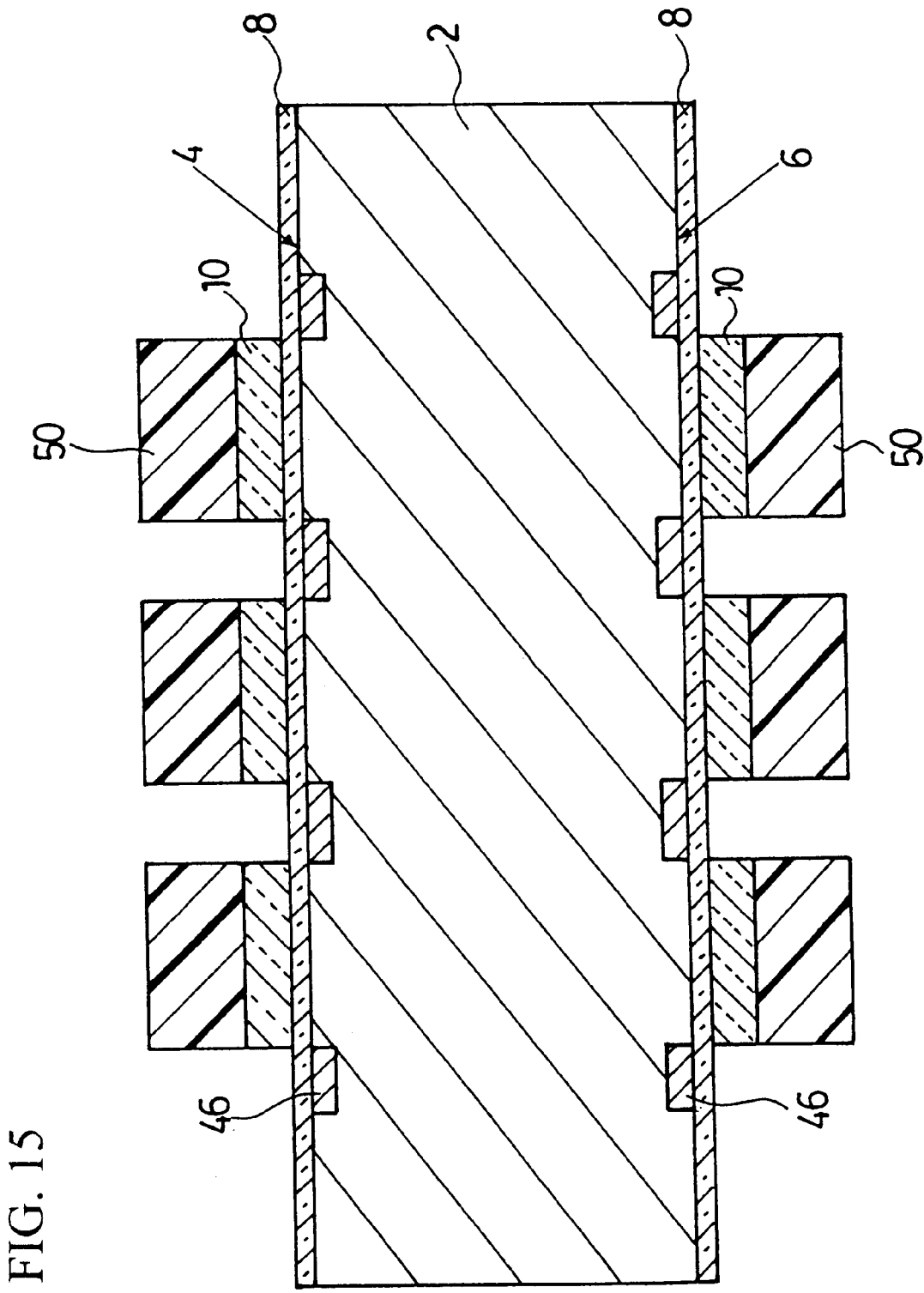

Subsequently, as shown in FIG. 15, LOCOS films forming silicon nitride films 10 are formed in a thickness of 150 nm at 780° C., with a flow rate of $SiH2Cl_2/NH_3=90/900$ sccm, at a pressure of 0.6 Torr for 42 minutes using a reduced pressure CVD system for the purpose of partially forming the LOCOS films 14 made of silicon oxide film provided at both surfaces of the semiconductor substrate 2.

The photoresists 50 serving as an etching mask are entirely coated on both surfaces of the semiconductor substrate 2, and then are developed after being exposed using the photoresists 50 as a photo mask, followed by patterning. Then, the LOCOS film forming silicon nitride films 10 are etched using sulfur hexafluoride ($SF_6$), helium (He), and methane trifluoride ($CHF_3$) in a parallel plate dry etching system having an RF power supply at a pressure of 0.3 Torr for 1 minute so that the exposed part of the LOCOS film forming silicon nitride films 10 is removed along the pattern of the photoresists 50. Thereafter, the photoresists 50 are entirely peeled off.

Figure 16:
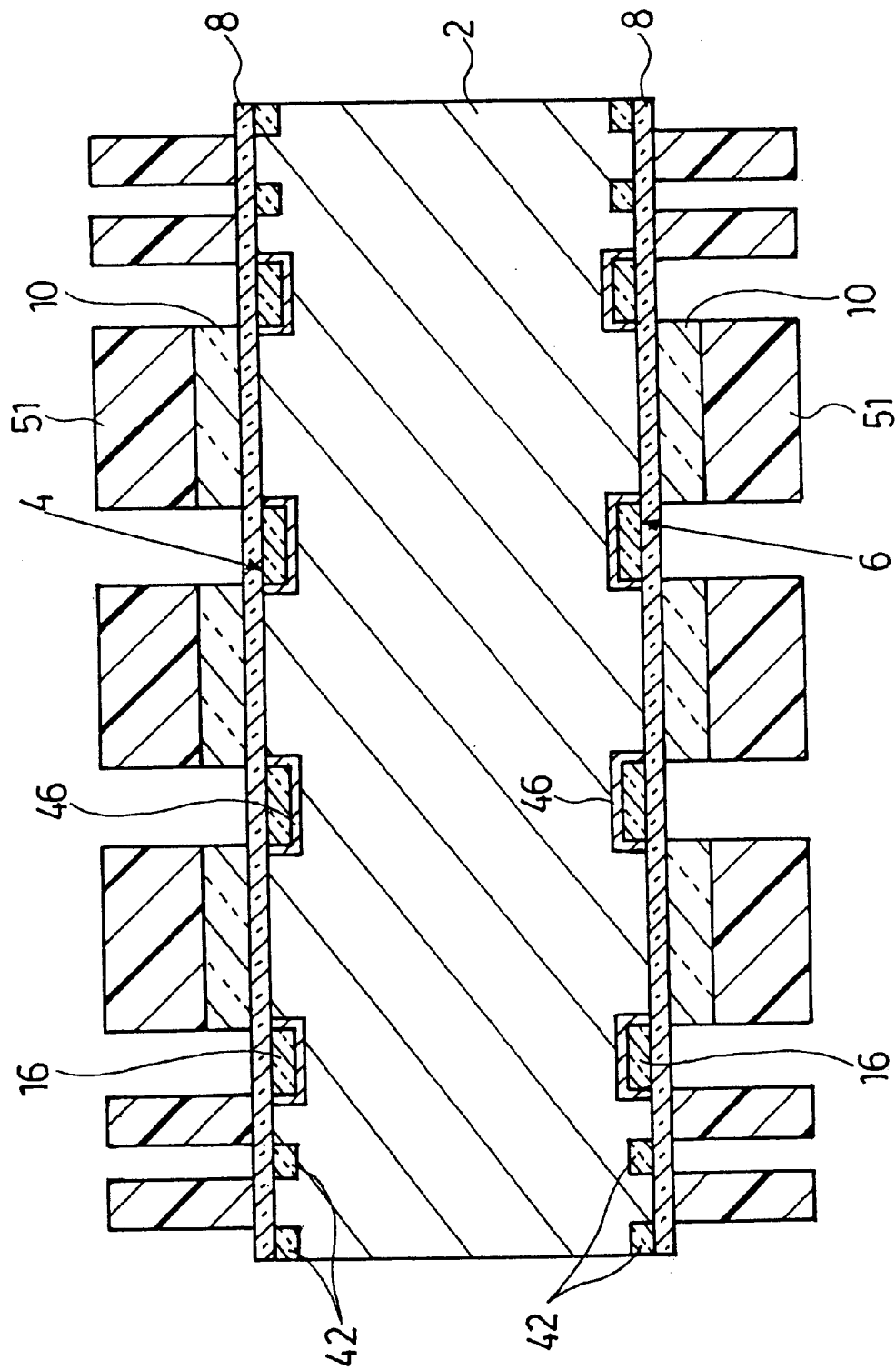

Then as shown in FIG. 16, photoresists 51 are coated on all surfaces for perforating the region where the emitter-push restraining layers 16 and the electric field relaxation layers 42 are formed on both surfaces of the semiconductor substrate 2, then they are developed after being exposed using the photomask, followed by patterning. Boron which is a p-type impurity is implanted in both surfaces of the n-type semiconductor substrate 2 using the photoresist 51 as an ion implantation mask at a dose of $1.0\times10^{15}$ atoms/cm$^2$ with 30 KeV energy.

As a result, the p-type emitter-push restraining layers are formed in the buried layers 46 and the p-type electric field relaxation layers 42 are formed to surround the device regions. Thereafter, the photoresists 51 are removed.

Figure 17:
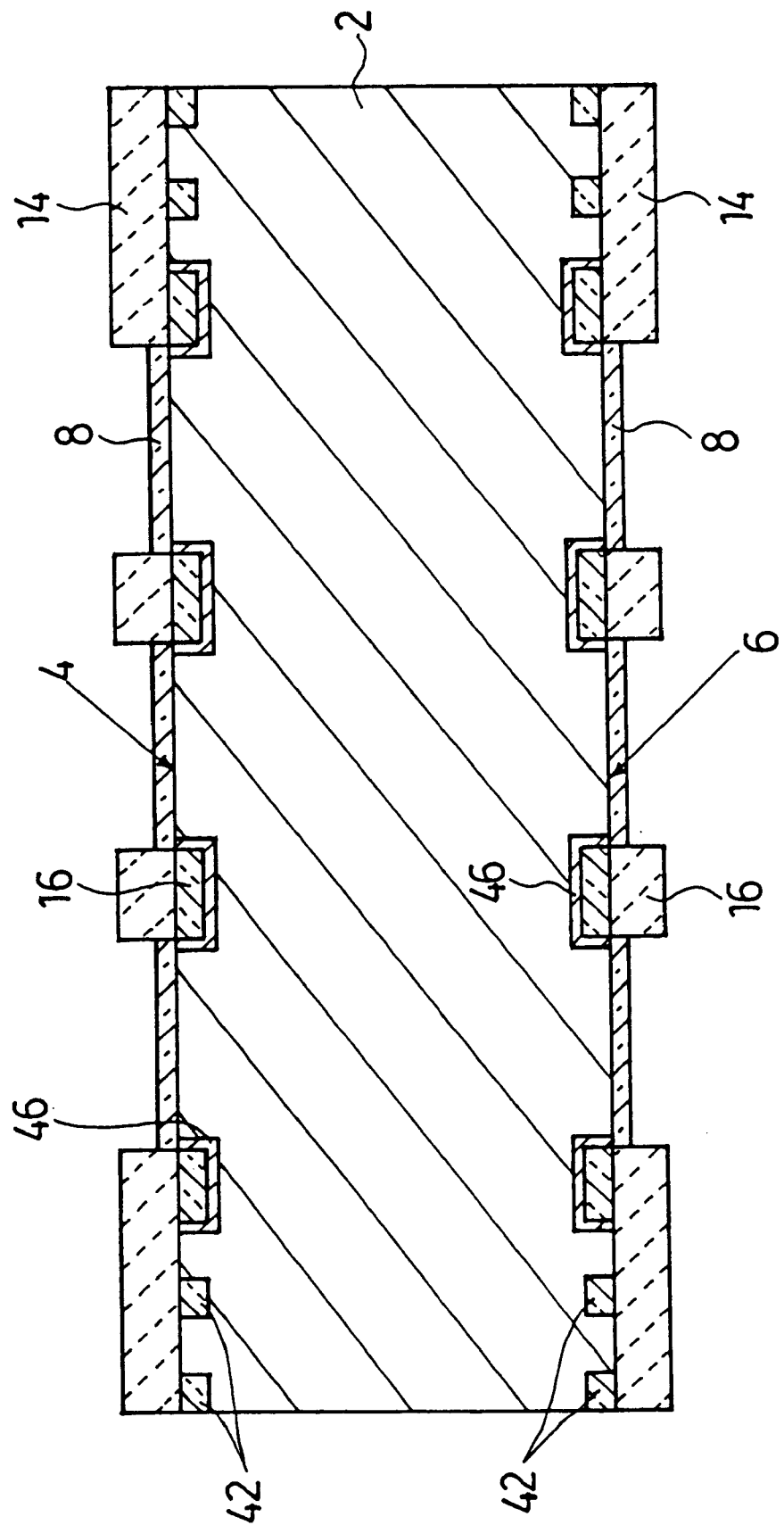

Then, as shown in FIG. 17, an oxidation is performed at 1140° C., with a flow rate of $O_2/N_2=0.06/9.0$ liter/min. for 20 minutes while the LOCOS film forming silicon nitride films 10 serves as an antioxidation film and the LOCOS films 14 are formed in a thickness of 500 nm at 1140° C. for 20 minutes in the oxygen atmosphere at the region where the LOCOS film forming silicon nitride films 10 are not formed.

Figure 18:
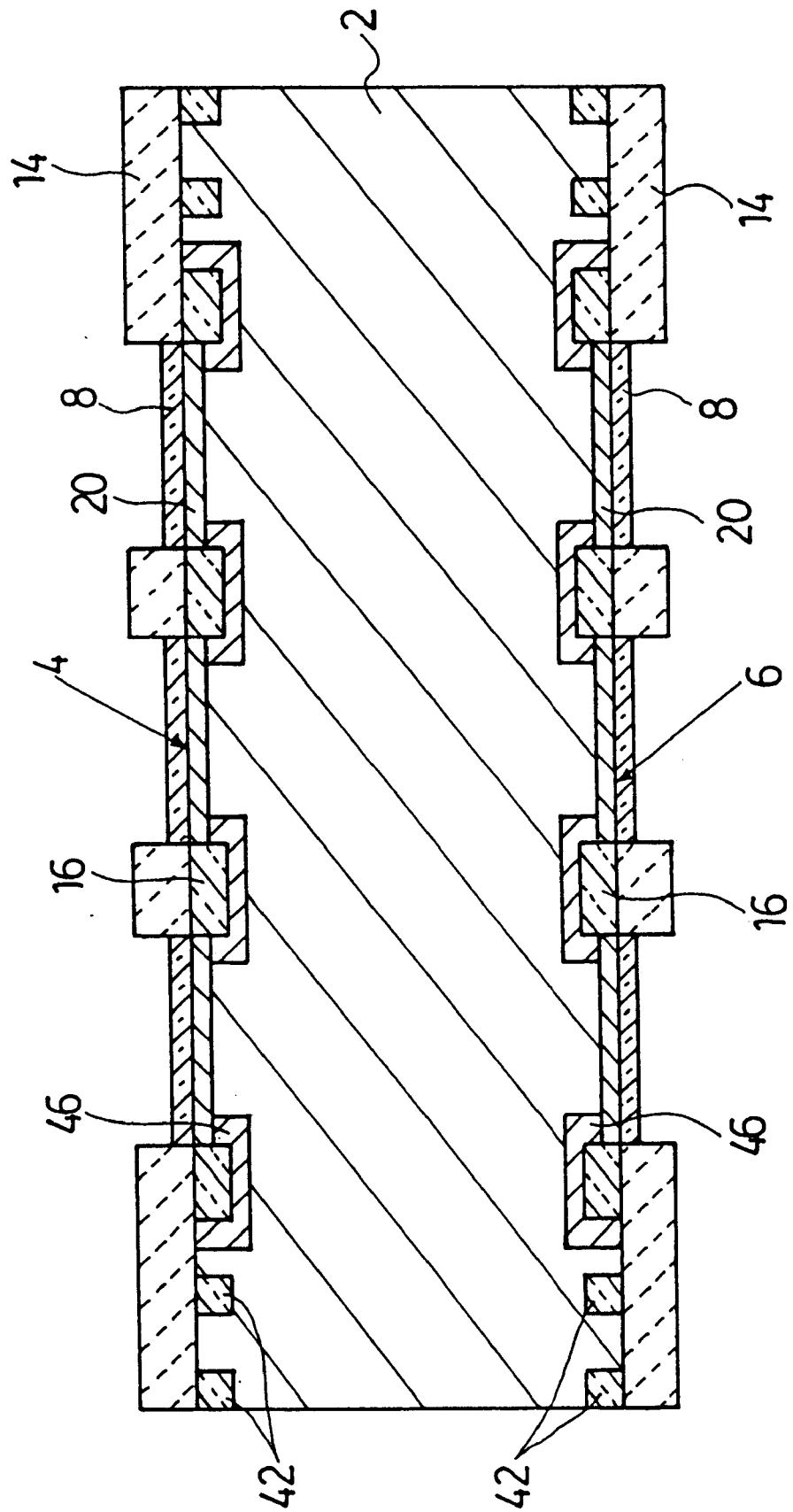

Then as shown in FIG. 18, boron which is a p-type impurity is implanted in both surfaces of the n-type semiconductor substrate 2 at a dose of $7.0\times10^{12}$ atoms/cm$^2$ with 60 KeV energy using the LOCOS films 14 as an ion implantation mask.

Thereafter, the drive-in process is performed at 1140° C. for 30 hours in the nitrogen atmosphere to diffuse the implanted impurities at both surfaces of the semiconductor substrate 2, so that the p-type base layers 20 are formed on the region where the LOCOS films 14 are not formed.

It is possible to determine the operation voltage of the device based on the width and the concentration of the p-type base layers 20.

Figure 19:
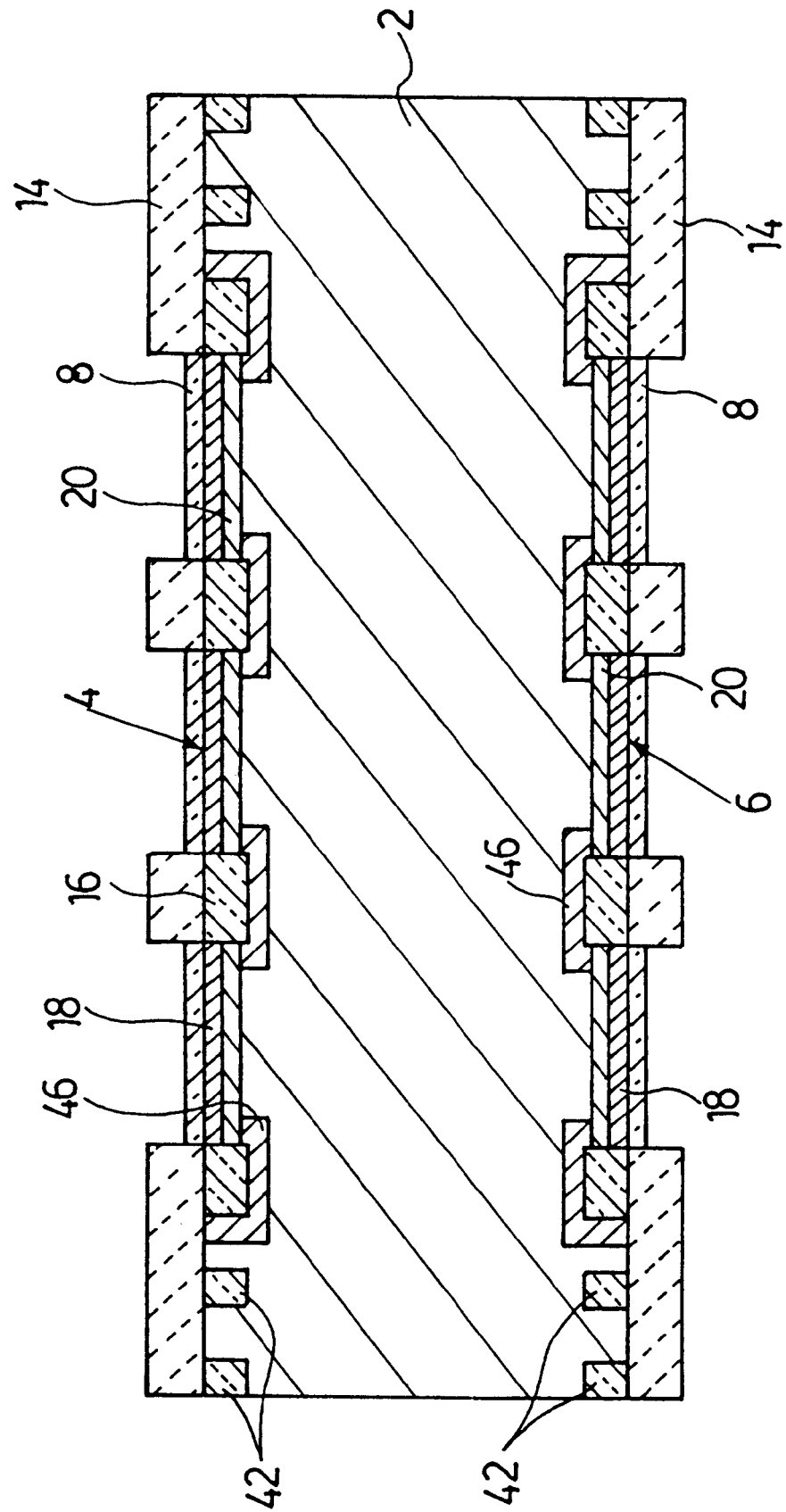

Subsequently, as shown in FIG. 19, phosphorus which is an n-type impurity is implanted in both surfaces of the n-type semiconductor substrate 2 at a dose of $5.5\times10^{15}$ atoms/cm$^2$ with 80 KeV energy using the LOCOS films 14 as an ion implantation mask.

Thereafter, phosphorus is processed at 1100° C. with a flow rate of $O_2/N_2=0.45/8.55$ liter/min. for 80 minutes, then it is further processed at 1140° C. for 20 minutes in an oxygen atmosphere followed by drive-in at 1140° C. for 10 minutes in a nitrogen atmosphere, thereby diffusing on both surfaces of the semiconductor substrate 2 to form the n-type emitter layers 18 on the upper portions alone of the p-type base layer 20.

Figure 20:
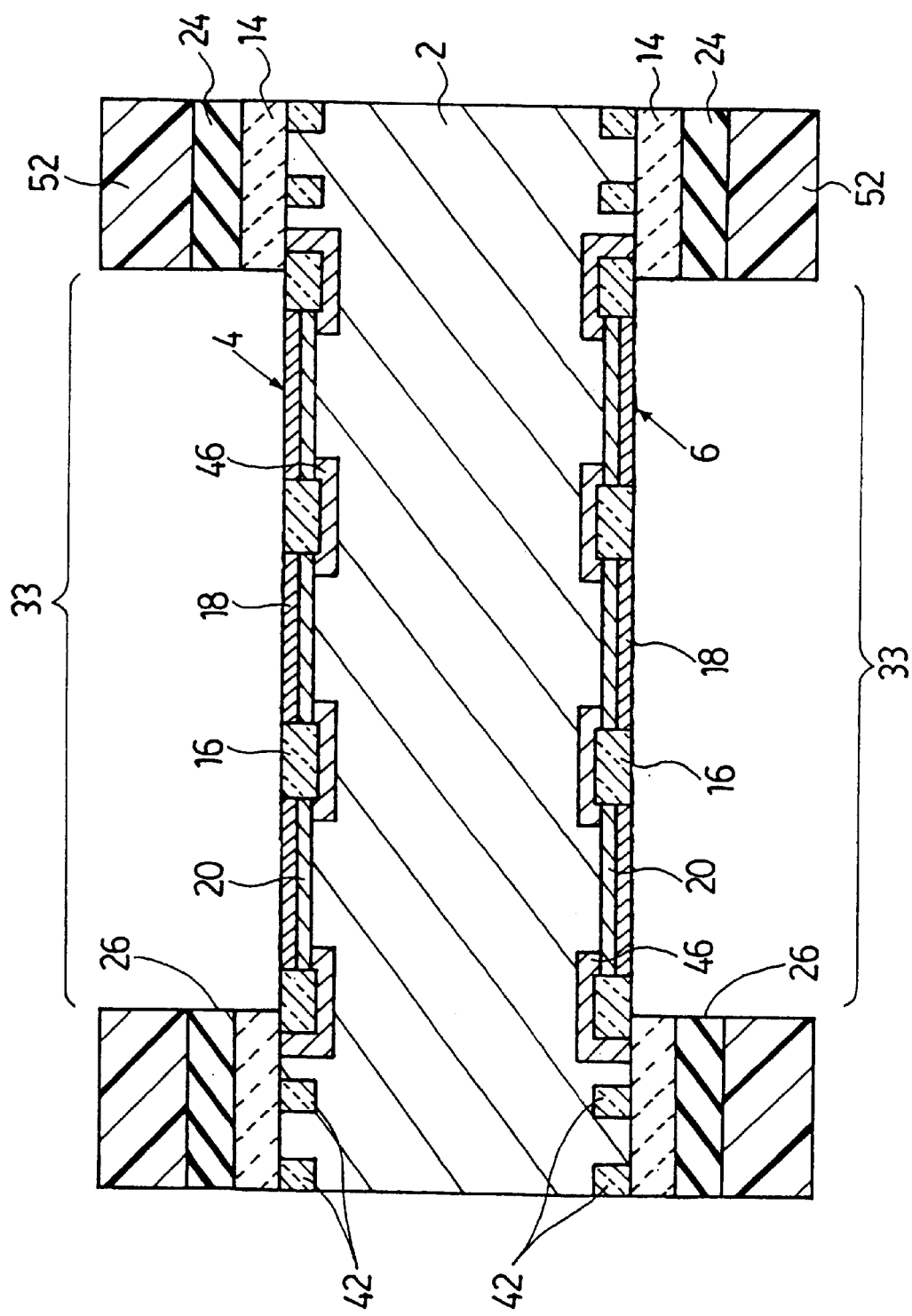

Thereafter, as shown in FIG. 20, both surfaces of the semiconductor substrate 2 are processed at 460° C. for 1 minute using a mixed gas of phosphine ($PH_3$) and monosilane ($SiH_4$) by a thermo CVD, thereby forming the PSG films 24 in a thickness of 500 nm.

Thereafter, photoresists 52 serving as an etching mask are coated on both entire surfaces of the semiconductor substrate 2, then they are exposed using a photomask followed by developing. Then, they are processed for 11 minutes using a wet etching liquid of ammonium fluoride solution, thereby forming the contact holes 26 on both surfaces of the semiconductor substrate 2. Thereafter, the photoresists 52 are peeled off entirely.

Figure 21:
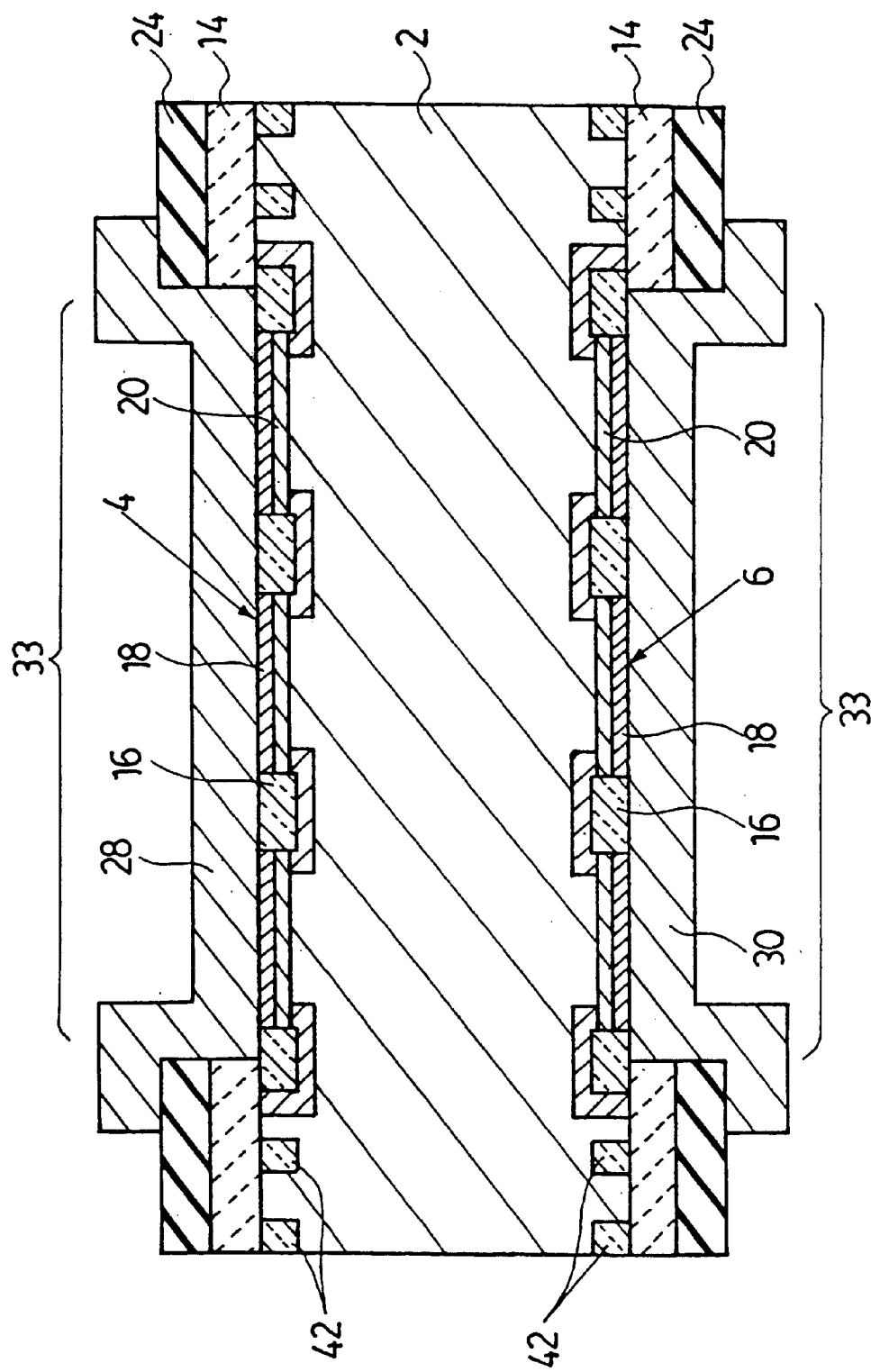

Thereafter, as shown in FIG. 21, the front metal electrode 28 and the back metal electrode 30 are formed on device regions 33, 33 provided on both surfaces of the n-type semiconductor substrate 2 through the contact holes 26, 26.

Figure 22:
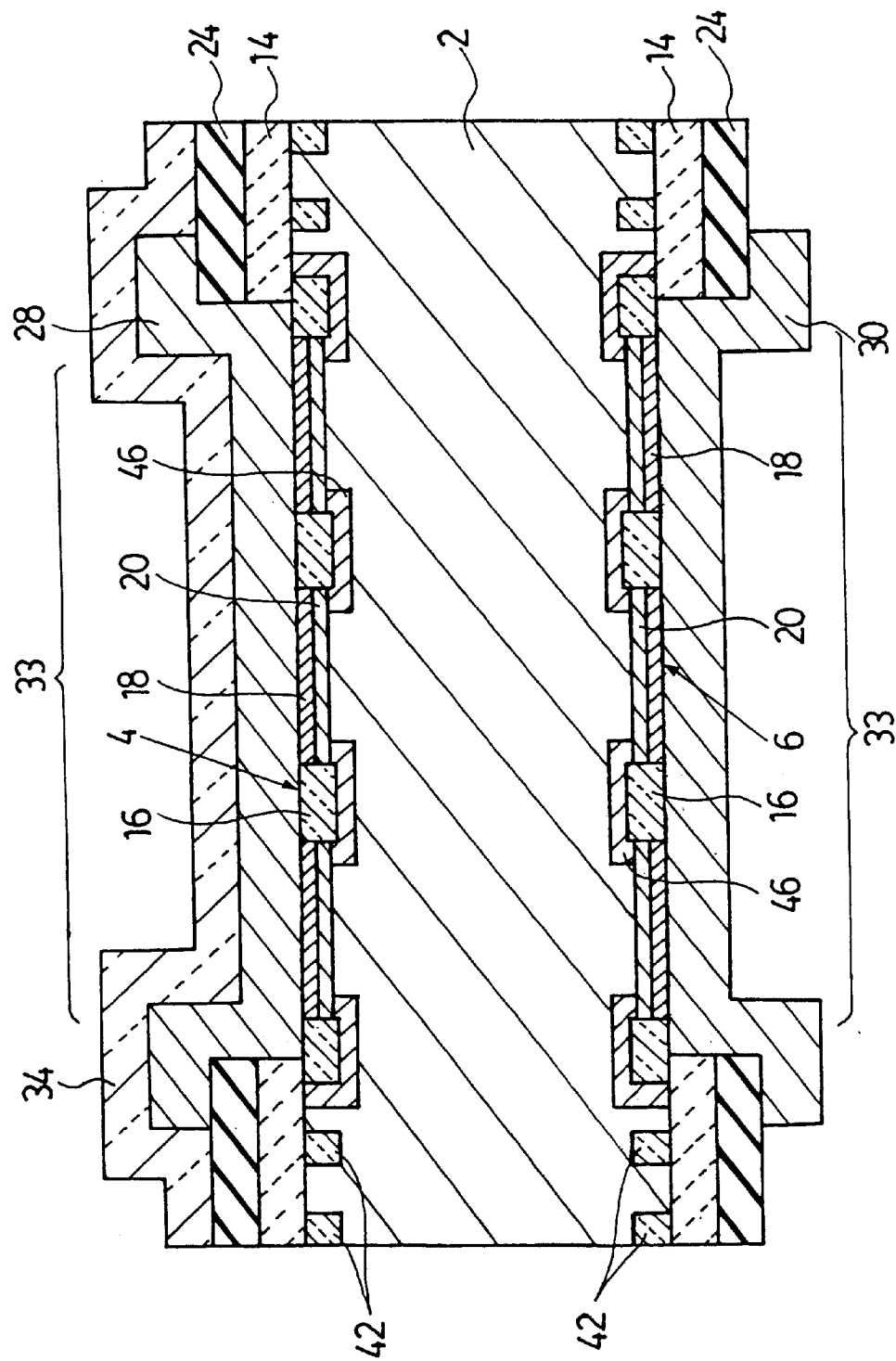
Figure 23:
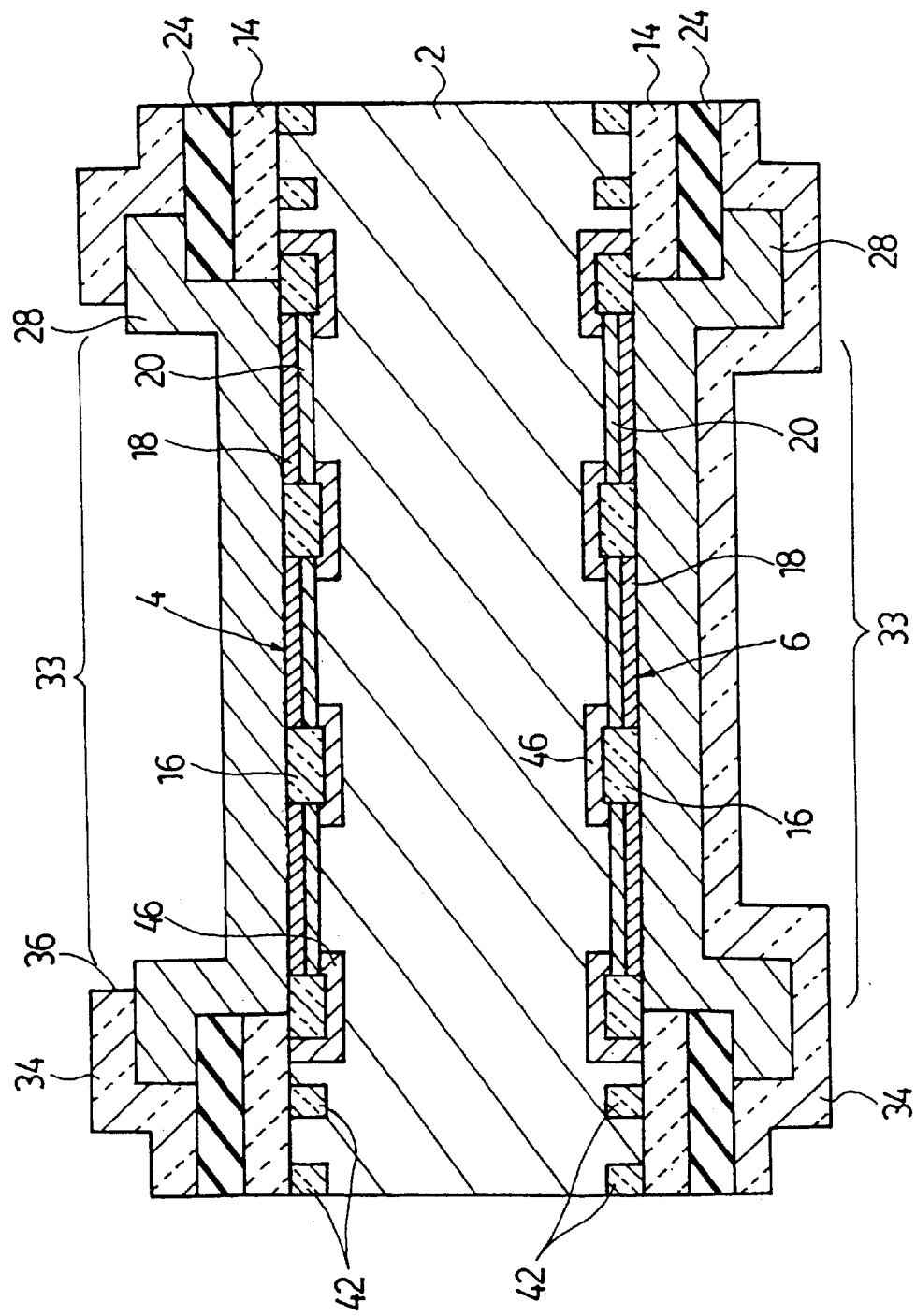
Figure 24:
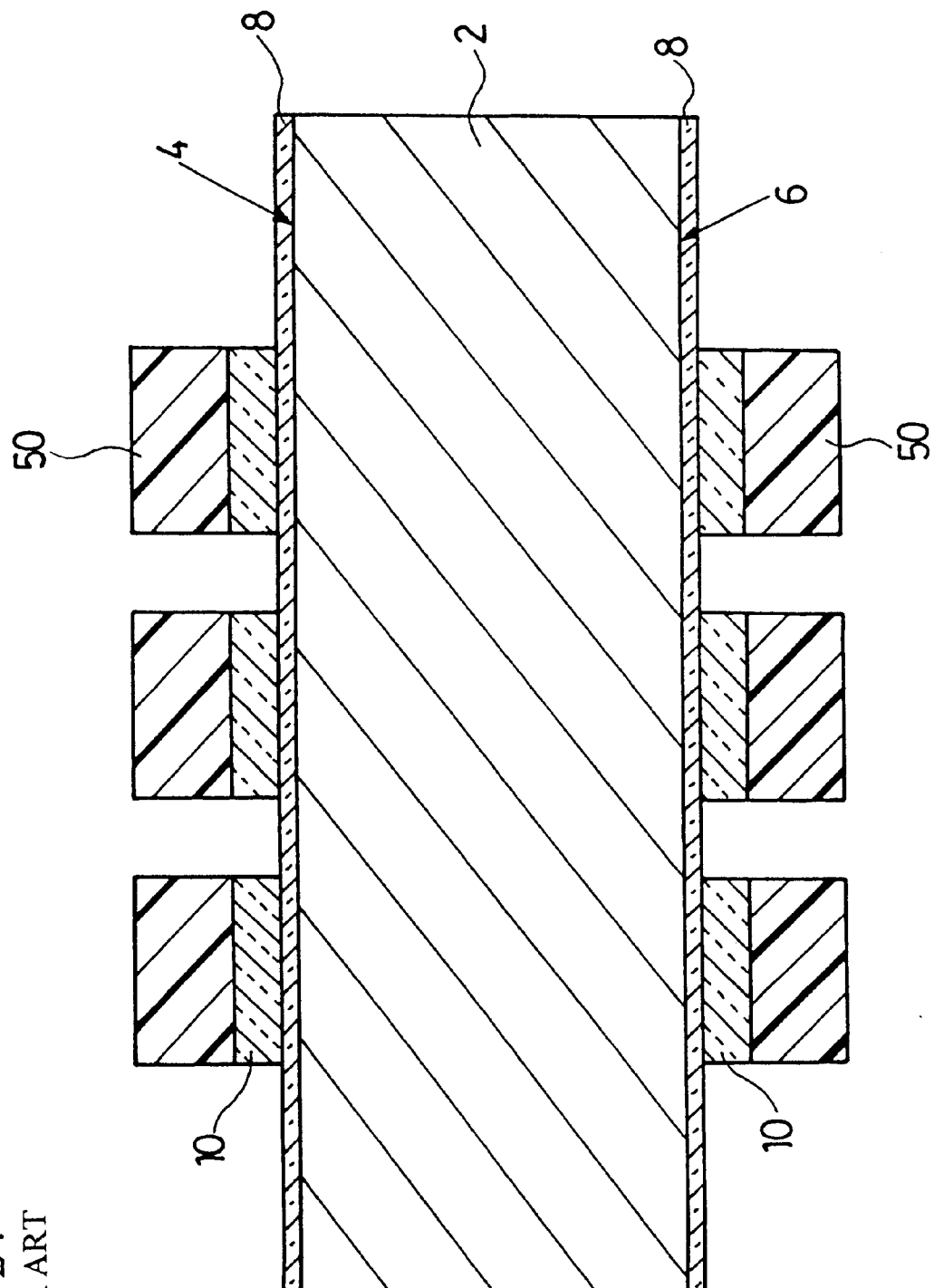
FIGS. 24 to 30 are sectional views respectively showing each step of a method of fabricating a conventional surge protection device.
Figure 25:
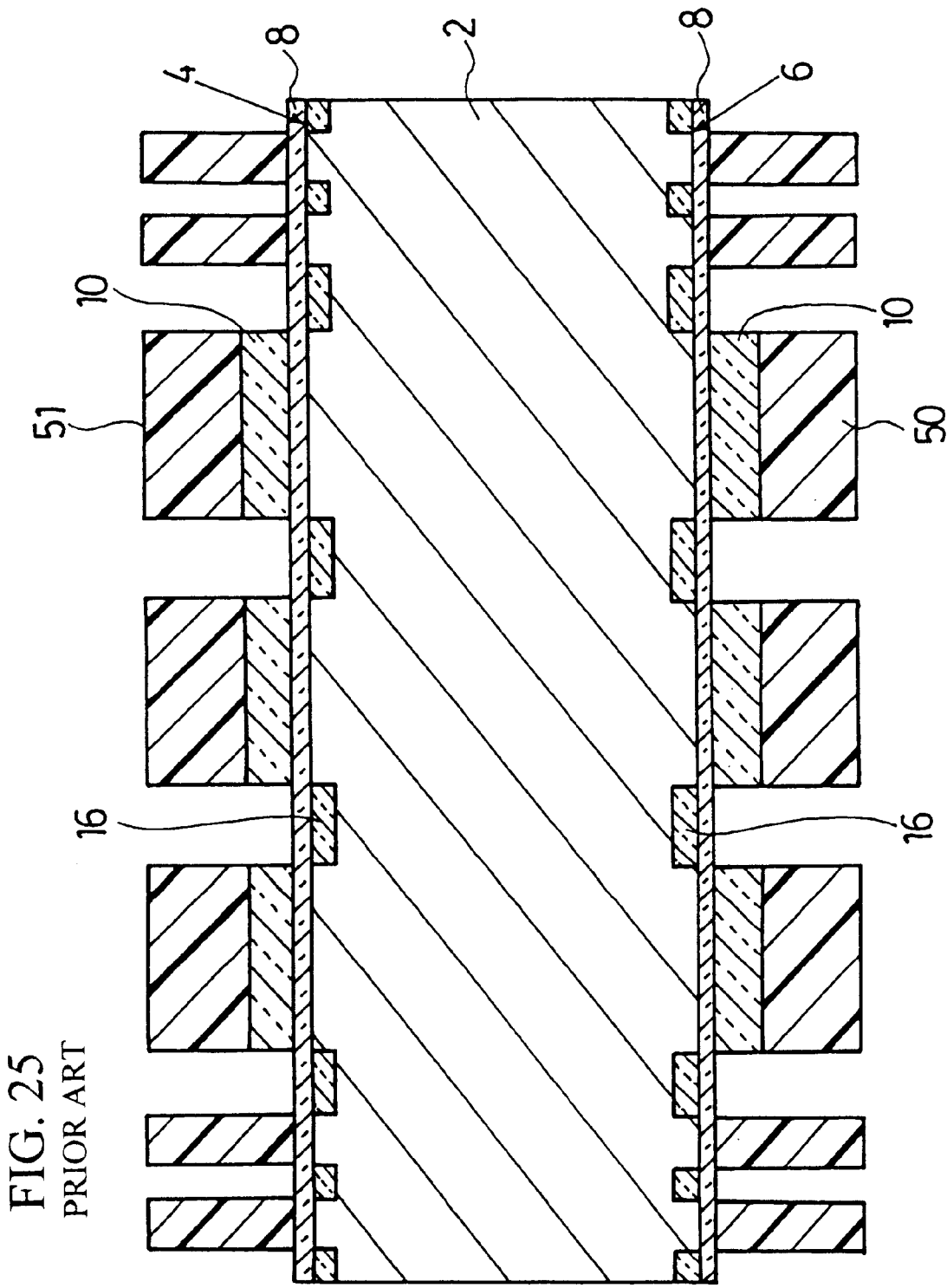
Figure 26:
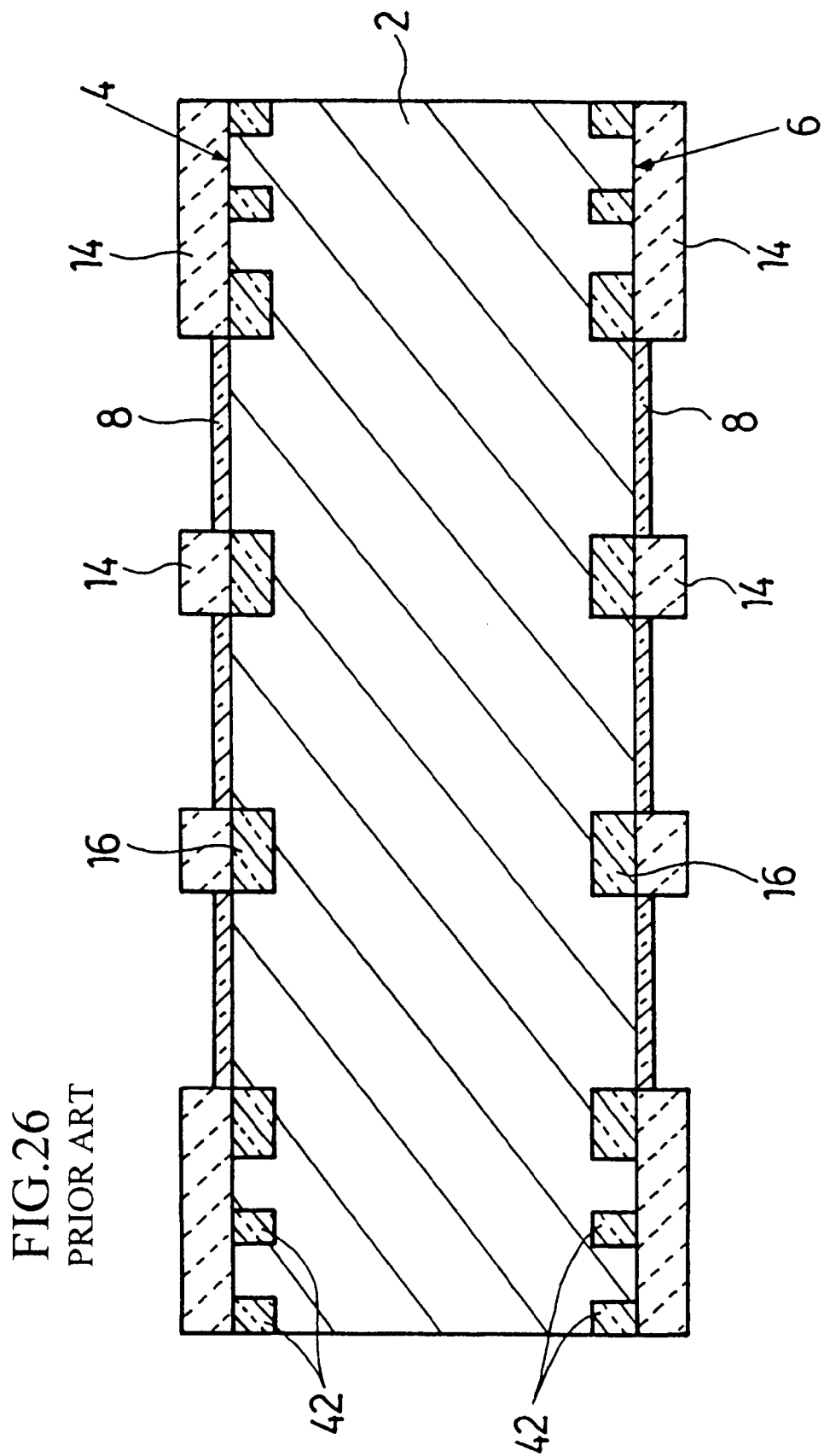
Figure 27:
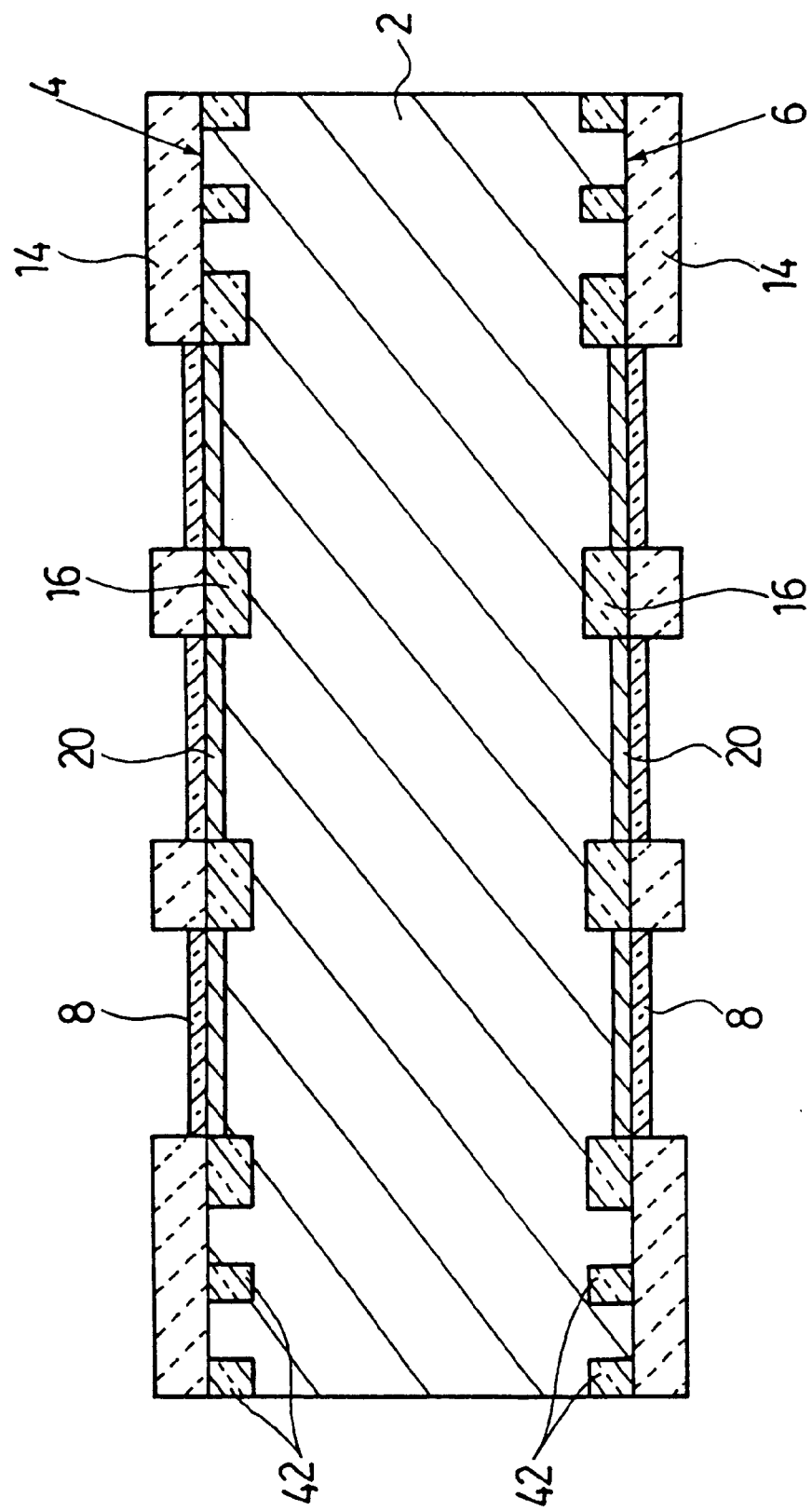
Figure 28:
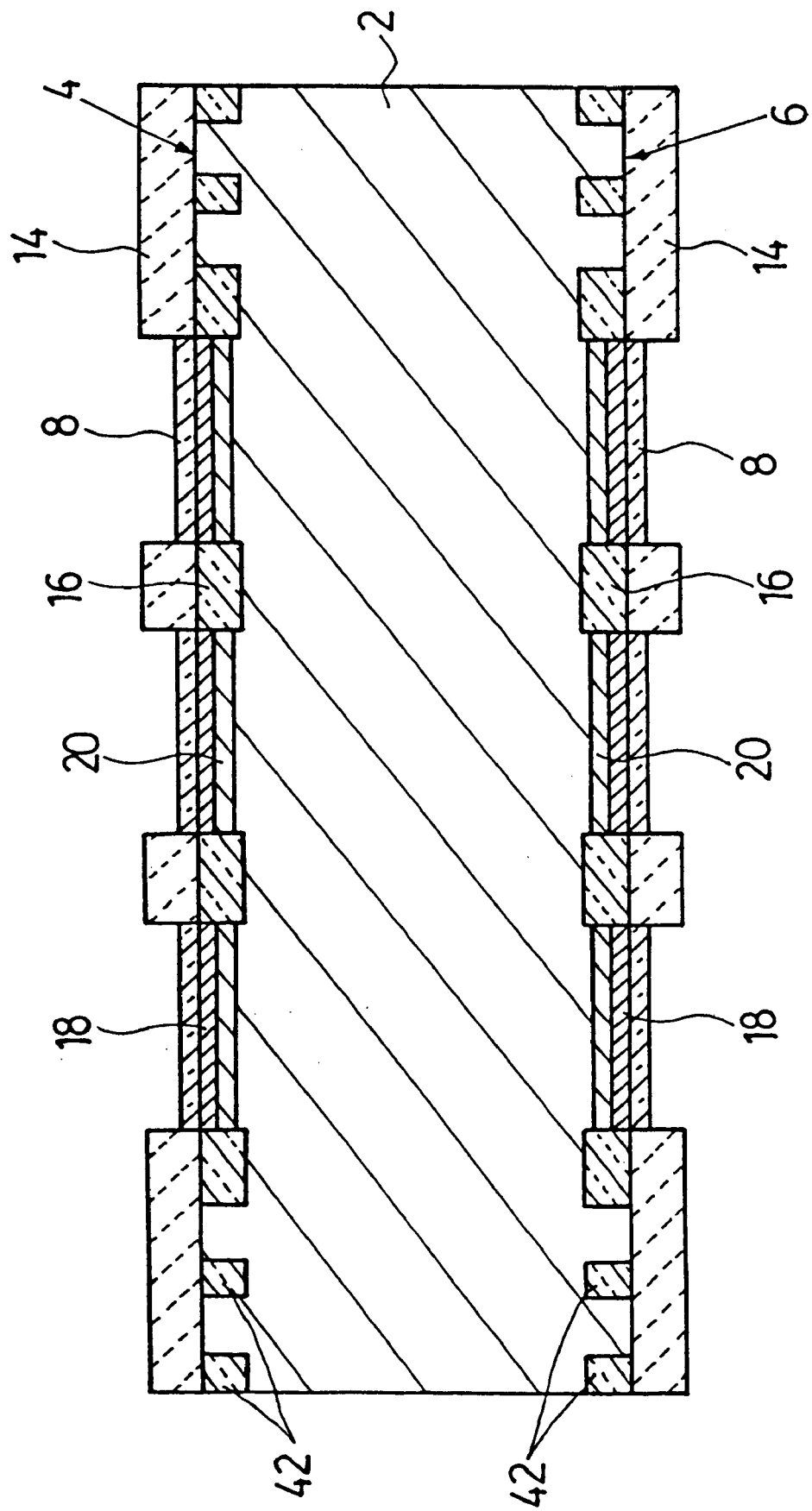
Figure 29:
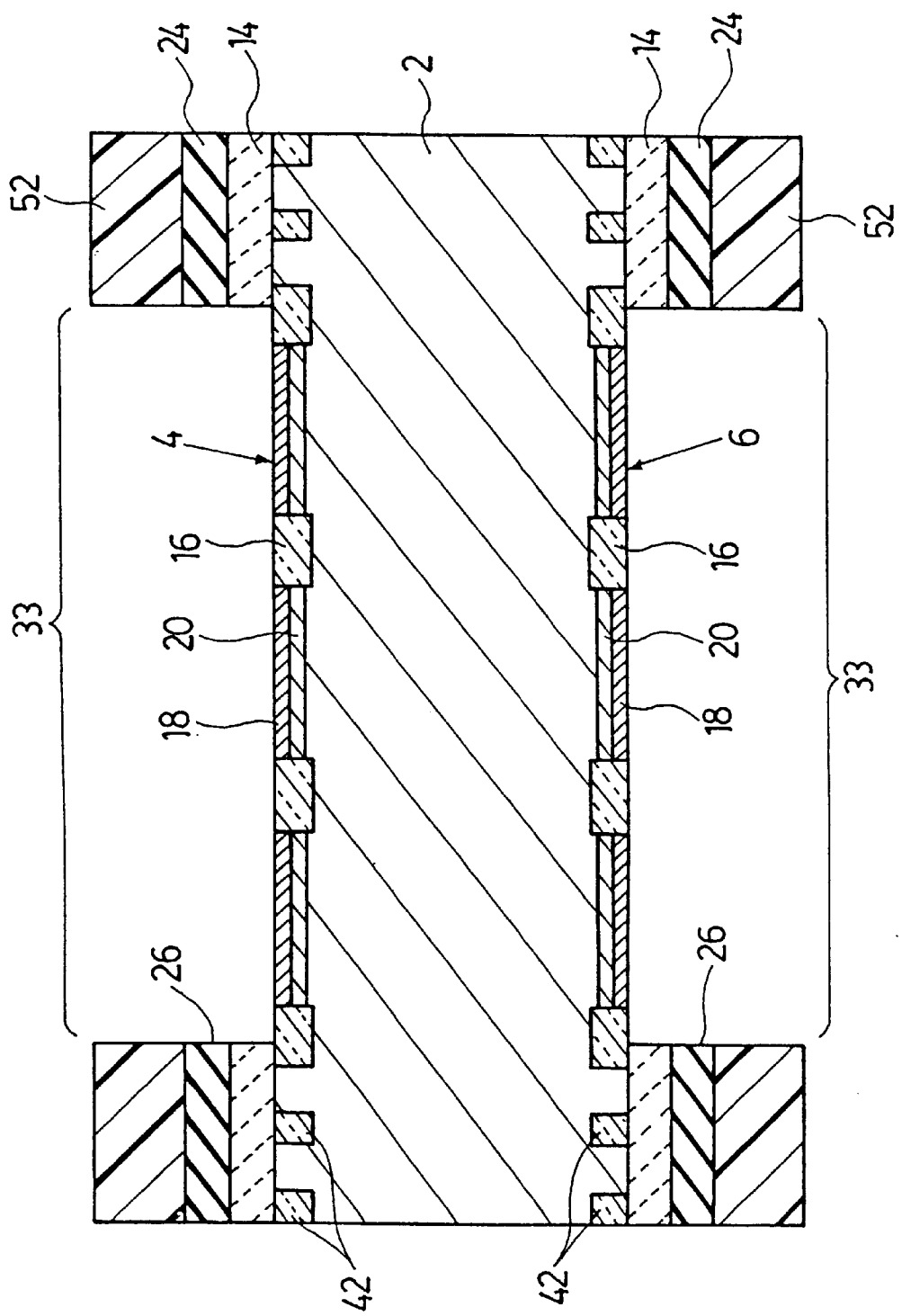

Then, as shown in FIG. 22, passivation films 34 made of silicone nitride film are formed on the front surface 4 of the semiconductor substrate 2 and openings 36 are formed in the passivation films 34 corresponding to the device regions 33.

Thereafter, the passivation films 34 made of silicone nitride film are formed on the back surface 6 of the semiconductor substrate 2 and openings 36 corresponding to the device region 33 are formed in the passivation films 34, as shown in FIG. 13.

The details of respective steps are the same as those of the method of the first embodiment, and hence the explanation thereof is omitted.

In the explanation of the second embodiment of the method of fabricating the surge protection device, the conduction type of the semiconductor substrate 2 is n-type. Then, the n-type buried layers 46 and the p-type emitter-push restraining layers 16, the p-type electric field relaxation layers 42, and the n-type emitter layers 18 and the p-type base layers 20 are respectively formed on both surfaces of the n-type semiconductor substrate 2.

If the p-type semiconductor substrate is used as the semiconductor substrate 2, the p-type buried layers 46, the p-type emitter-push restraining layers 16, the n-type electric field relaxation layers 42, and the p-type emitter layers 18 and the n-type base layers 20 may be respectively formed. In this case, the same effect as in the second embodiment can be obtained.

Other modifications and operations set forth in the method of the first embodiment can be also applied to the second embodiment.

As is evident from the above explanation, according to the surge protection device of the present invention, the n-type or the p-type buried layers, which have the same conduction type as, and are higher in impurity concentration than, the semiconductor substrate, are formed on the entire surfaces of the device regions provided on both surfaces of the semiconductor substrate or formed under emitter-push restraining layers alone.

Accordingly, it is possible to restrain the amount of injection of minority carriers from a surface opposite to the surface on which the device operates to lower the holding current, whereby the bidirectional surge protection device easily switches OFF once it becomes ON, thereby keeping the holding current high.

What is claimed is:

1. A surge protection device comprising:
   a semiconductor substrate;
   buried layers formed on entire surfaces of device regions on both surfaces of the semiconductor substrate, said buried layers being higher in impurity concentration than the semiconductor substrate and restraining the injection of minority carriers;
   base layers selectively formed inside the buried layers to determine a voltage at which the device becomes ON;
   emitter layers formed on the upper portions alone of the base layers for injecting minority carriers after the device becomes ON;
   emitter-push restraining layers selectively formed inside the buried layers so as to avoid an electric field concentration at the end portions of the base layers and emitter layers to uniformly operate the device;
   electric field relaxation layers formed on both surfaces of the semiconductor substrate to surround peripheries of device regions for keeping a sufficient withstand voltage so as to avoid break down in a lateral direction;
   LOCOS films selectively formed on the peripheries of the device regions provided on both surfaces of the semiconductor substrate;
   interlayer insulators formed on the LOCOS films provided on both surfaces of the semiconductor substrate;
   metal electrodes formed on the device regions formed on both surfaces of the semiconductor substrate to overlap with the interlayer insulators at a part thereof; and
   passivation films formed on the peripheries of the device regions provided on both surface of the semiconductor substrate to overlap with the metal electrodes.

2. The surge protection device according to claim 1, wherein the semiconductor substrate, the buried layers, and the emitter layers are respectively n-type, while the emitter-push restraining layers, the electric field relaxation layers, and the base layers are respectively p-type.

3. The surge protection device according to claim 1, wherein the semiconductor substrate, the buried layers, and the emitter layers are respectively p-type, while the emitter-push restoring layer, the electric field relaxation layers, and the base layers are respectively n-type.

4. A method of fabricating a surge protection device comprising:
   a step of selectively forming n-type buried layers which are higher in impurity concentration than an n-type semiconductor substrate on all surfaces of device regions so as to restrain the injection of minority carriers in both surfaces of the n-type semiconductor substrate;
   a step of selectively forming p-type emitter-push restraining layers inside the n-type buried layers on the device regions provided on both surfaces of the n-type semiconductor substrate so as to avoid an electric field concentration at end portions of base layers and emitter layers to be formed latter;
   a step of forming p-type electric field relaxation layers so as to surround peripheries of the device regions provided on both surfaces of the n-type semiconductor substrate at the same time when the p-type emitter-push restraining layers are formed;
   a step of forming p-type base layers on the device regions provided on both surfaces of the n-type semiconductor substrate using LOCOS films for alignment after the LOCOS films are selectively formed on both surfaces of the n-type semiconductor substrate;
   a step of forming n-type emitter layers on the upper portions alone of the p-type base layers in the device regions provided on both surfaces using the LOCOS films for alignment;
   a step of forming interlayer insulators on both entire surfaces of the n-type semiconductor substrate;
   a step of subjecting photoresists to patterning on the interlayer insulators formed on both surfaces of the n-type semiconductor substrate by a photolithography process, then etching the interlayer insulators to form contact holes in the device regions provided on both surfaces of the n-type semiconductor substrate;
   a step of forming metal electrodes on both surfaces of the n-type semiconductor substrate within each contact holes;
   a step of forming passivation films on both entire surfaces of the n-type semiconductor substrate; and
   a step of subjecting photoresists to patterning on the passivation films provided on both surfaces of the n-type semiconductor substrate using a photolithography process, then etching the passivation films to perforate the device regions on both surfaces.

5. A method of fabricating a surge protection device comprising:
   a step of selectively forming p-type buried layers which are higher in impurity concentration than a p-type semiconductor substrate on all surfaces of device regions so as to restrain the injection of minority carriers in both surfaces of the p-type semiconductor substrate;
   a step of selectively forming n-type emitter-push restraining layers inside the p-type buried layers on the device regions provided on both surfaces of the p-type semiconductor substrate so as to avoid an electric field concentration at end portions of base layers and emitter layers to be formed latter;

a step of forming n-type electric field relaxation layers so as to surround peripheries of the device regions provided on both surfaces of the p-type semiconductor substrate at the same time when the n-type emitter-push restraining layers are formed;

a step of forming n-type base layers on the device regions provided on both surfaces of the p-type semiconductor substrate using LOCOS films for alignment after the LOCOS films are selectively formed on both surfaces of the p-type semiconductor substrate;

a step of forming p-type emitter layers on the upper portions alone of the n-type base layers in the device regions provided on both surfaces using the LOCOS films for alignment;

a step of forming interlayer insulators on both entire surfaces of the p-type semiconductor substrate;

a step of subjecting photoresists to patterning on the interlayer insulators formed on both surfaces of the p-type semiconductor substrate by a photolithography process, then etching the interlayer insulators to form contact holes in the device regions provided on both surfaces of the p-type semiconductor substrate;

a step of forming metal electrodes on both surfaces of the p-type semiconductor substrate within each contact holes;

a step of forming passivation films on both entire surfaces on the p-type semiconductor substrate; and a step of subjecting photoresists to patterning on the passivation films provided on both surfaces of the p-type semiconductor substrate using a photolithography process, then etching the passivation films to perforate the device regions on both surfaces.

6. A surge protection device comprising:

a semiconductor substrate;

base layers selectively formed on device regions provided on both surfaces of the semiconductor substrate so as to determine a voltage at which the device becomes ON;

emitter layers formed on the upper portions alone of the base layers provided on both surfaces of the semiconductor substrate for injecting minority carriers in the base layers after the device becomes ON;

emitter-push restraining layers selectively formed to surround the base layers and the emitter layers formed on device regions provided on both surfaces of the semiconductor substrate to avoid an electric field concentration at end portions of the base layers and emitter layers to uniformly operate the device;

buried layers formed under the emitter-push restraining layers alone provided on both surfaces of the semiconductor to restrain the injection of minority carriers, said buried layers being higher in impurity concentration than the semiconductor substrate;

electric field relaxation layers formed on both surfaces of the semiconductor to surround the peripheries of the device regions for keeping a sufficient withstand voltage so as to avoid break down in a lateral direction:

LOCOS films selectively formed on the peripheries of the device regions provided on both surfaces of the semiconductor;

interlayer insulators formed on the LOCOS films provided on both surfaces of the semiconductor substrate;

metal electrodes formed on the device regions provided on both surfaces of the semiconductor substrate to overlap with interlayer layers at a part thereof; and passivation films formed on the peripheries of the device regions provided on the semiconductor substrate to overlap with over the metal electrodes.

7. The surge protection device according to claim 6, wherein the semiconductor substrate, the buried layers, and the emitter layers are respectively n-type, while the emitter-push restraining layers, the electric field relaxation layers, and the base layers are respectively p-type.

8. The surge protection device according to claim 6, wherein the semiconductor substrate, the buried layers, and the emitter layers are respectively p-type, while the emitter-push restraining layers, the electric field relaxation layers, and the base layers are respectively n-type.

9. A method of fabricating a surge protection device comprising:

a step of selectively forming n-type buried layers on device regions provided on both surfaces of an n-type semiconductor substrate, said n-type buried layers being higher in impurity concentration than the n-type semiconductor substrate for restraining injection of minority carriers;

a step of selectively forming p-type emitter-push restraining layers on upper portions alone of the n-type buried layers provided on both surfaces of the n-type semiconductor substrate, said emitter-push restraining layers avoiding electric field concentration at end portions of base layers and emitter layers respectively formed later;

a step of forming p-type electric field relaxation layers so as to surround peripheries of the device regions provided on both surfaces of the n-type semiconductor substrate at the same time when forming the p-type emitter-push restraining layers;

a step of forming p-type base layers on the device regions provided on both surfaces of the n-type semiconductor substrate using LOCOS films for alignment after the LOCOS films are selectively formed on both surfaces of the n-type semiconductor substrate;

a step of forming n-type emitter layers on upper portions alone of the p-type base layers formed on the device regions provided on both surfaces of the n-type semiconductor substrate using the LOCOS films for alignment;

a step of forming interlayer insulators formed on both entire surfaces of the n-type semiconductor substrate;

a step of subjecting photoresists to patterning on the interlayer insulators provided on both surfaces of the n-type semiconductor substrate by a photolithography process, then etching the interlayer insulators to form contact holes in the device regions on both surfaces of the n-type semiconductor substrate;

a step of forming metal electrode on both surfaces of the n-type semiconductor substrate within respective contact holes;

a step of forming passivation films on both entire surfaces of the n-type semiconductor substrate; and a step of subjecting photoresists to patterning on the passivation films provided on both surfaces of the n-type semiconductor substrate by a photolithography process, then etching the passivation films to perforate the device regions on both surfaces of the n-type semiconductor substrate.

10. A method of fabricating a surge protection device comprising:

a step of selectively forming p-type buried layers on device regions provided on both surfaces of a p-type semiconductor substrate, said p-type buried layers being higher in impurity concentration than the p-type semiconductor substrate for restraining injection of minority carriers;

a step of selectively forming n-type emitter-push restraining layers on upper portions alone of the p-type buried layers provided on both surfaces of the p-type semiconductor substrate, said emitter-push restraining layer avoiding electric field concentration at end portions of base layers and emitter layers respectively formed later;

a step of forming n-type electric field relaxation layers so as to surround peripheries of the device regions provided on both surfaces of the p-type semiconductor substrate at the same time when forming the n-type emitter-push restraining layers;

a step of forming n-type base layers on the device regions provided on both surfaces of the p-type semiconductor substrate using LOCOS films for alignment after the LOCOS films are selectively formed on both surfaces of the p-type semiconductor substrate;

a step of forming p-type emitter layers on upper portions alone of the n-type base layers formed on the device regions provided on both surfaces of the p-type semiconductor substrate using the LOCOS films for alignment;

a step of forming interlayer insulators formed on both entire surfaces of the p-type semiconductor substrate;

a step of subjecting photoresists to patterning on the interlayer, insulators provided on both surfaces of the p-type semiconductor substrate by a photolithography process, then etching the interlayer insulators to form contact holes in the device regions on both surfaces of the p-type semiconductor substrate;

a step of forming metal electrode on both surfaces of the p-type semiconductor substrate within respective contact holes;

a step of forming passivation films on both entire surfaces of the p-type semiconductor substrate; and a step of subjecting photoresists to patterning on the passivation films provided on both surfaces of the p-type semiconductor substrate by a photolithography process, then etching the passivation films to perforate the device regions on both surfaces of the p-type semiconductor substrate.

* * * * *